United States Patent
Sim et al.

(10) Patent No.: US 11,935,876 B2
(45) Date of Patent: Mar. 19, 2024

(54) LIGHT-EMITTING ELEMENT INK, DISPLAY DEVICE, AND METHOD OF FABRICATING THE DISPLAY DEVICE

(71) Applicant: Samsung Display Co., Ltd., Yongin-si (KR)

(72) Inventors: Jun Bo Sim, Suwon-si (KR); Duk Ki Kim, Suwon-si (KR); Yong Hwi Kim, Asan-si (KR); Hyo Jin Ko, Seoul (KR); Chang Hee Lee, Seoul (KR); Chan Woo Joo, Changwon-si (KR); Jae Kook Ha, Seoul (KR); Na Mi Hong, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 201 days.

(21) Appl. No.: 17/241,943

(22) Filed: Apr. 27, 2021

(65) Prior Publication Data
US 2021/0391308 A1    Dec. 16, 2021

(30) Foreign Application Priority Data
Jun. 11, 2020   (KR) .................. 10-2020-0070897

(51) Int. Cl.
*H01L 25/075* (2006.01)
*B82B 3/00* (2006.01)
(Continued)

(52) U.S. Cl.
CPC ........ *H01L 25/0753* (2013.01); *B82B 3/0052* (2013.01); *C09D 11/037* (2013.01);
(Continued)

(58) Field of Classification Search
CPC .................................................. H10K 71/191
See application file for complete search history.

(56) References Cited

U.S. PATENT DOCUMENTS

| 2015/0276194 A1 | 10/2015 | Lowenthal et al. |
| 2022/0139871 A1* | 5/2022 | Hong ............. C09D 11/033 438/34 |

FOREIGN PATENT DOCUMENTS

| CN | 103608937 A | 2/2014 |
| CN | 109301051 A | 2/2019 |

(Continued)

OTHER PUBLICATIONS

Cheng, Guangyao et al.; "Color Spraying Technology for 3D Curved Surface"; Chapter 8. Research on Piezoelectric Injection Mechanism; Jul. 2018; 7pp.
(Continued)

*Primary Examiner* — Yu-Hsi D Sun
(74) *Attorney, Agent, or Firm* — Lewis Roca Rothgerber Christie LLP

(57) ABSTRACT

A light-emitting element ink, a display device, and a method of fabricating the display device are provided. The light-emitting element ink includes a light-emitting element solvent, light-emitting elements dispersed in the light-emitting element solvent, each of the light-emitting elements including a plurality of semiconductor layers and an insulating film that surrounds parts of outer surfaces of the semiconductor layers, and a surfactant dispersed in the light-emitting element solvent, the surfactant including a fluorine-based and/or a silicon-based surfactant.

4 Claims, 17 Drawing Sheets

(51) Int. Cl.
   *C09D 11/037*   (2014.01)
   *C09D 11/322*   (2014.01)
   *C09D 11/38*    (2014.01)
   *C09D 11/50*    (2014.01)
   *H01L 27/12*    (2006.01)
   *H01L 33/24*    (2010.01)
   *H01L 33/38*    (2010.01)
   *H01L 33/44*    (2010.01)
   *H01L 33/62*    (2010.01)

(52) U.S. Cl.
   CPC ............ *C09D 11/322* (2013.01); *C09D 11/38* (2013.01); *C09D 11/50* (2013.01); *H01L 27/1214* (2013.01); *H01L 33/24* (2013.01); *H01L 33/38* (2013.01); *H01L 33/44* (2013.01); *H01L 33/62* (2013.01); *H01L 2933/0066* (2013.01)

(56) References Cited

FOREIGN PATENT DOCUMENTS

| | | |
|---|---|---|
| CN | 110073495 A | 7/2019 |
| KR | 10-2020-0005711 A | 1/2020 |
| KR | 10-2020-0016424 A | 2/2020 |
| KR | 10-2020-0023581 A | 3/2020 |
| KR | 10-2021-0109079 | 9/2021 |

OTHER PUBLICATIONS

Hu, Weiyou; "Digital Printing and Computer to Plate Technology"; Second Edition; 2011; ISBN 978-7-5142-0224-3; 10pp.

Office action for corresponding CN 202110646445.7 dated Jul. 22, 2023, 12pp.

Li, Bo et al.; "3D Printing Technology: 2.4.1 Basic Principle and Molding Flow"; China Light Industry Press; Aug. 30, 2017; 6pp.

Wang, Zhongxia et al.; "Engraving and plate-making"; China Textile & Apparel Press; Jul. 30, 2006; 3pp.

\* cited by examiner

LIGHT-EMITTING ELEMENT INK, DISPLAY DEVICE, AND METHOD OF FABRICATING THE DISPLAY DEVICE

CROSS-REFERENCE TO RELATED APPLICATION

This application claims priority to and the benefit of Korean Patent Application No. 10-2020-0070897, filed on Jun. 11, 2020, in the Korean Intellectual Property Office, the entire content of which is hereby incorporated by reference.

BACKGROUND

1. Field

Embodiments of the present disclosure relate to light-emitting element ink, a display device, and a method of fabricating the display device.

2. Description of the Related Art

Display devices have increasingly become of greater importance with the development of multimedia, and various types of display devices, such as an organic light-emitting diode (OLED) display device, a liquid crystal display (LCD) device, and the like, have been used.

A display device, which displays an image, may include a display panel such as an OLED display panel or an LCD panel. The display panel, for example, a light-emitting element display panel, may include light-emitting elements. For example, light-emitting diodes (LEDs) may include OLEDs using an organic material as a fluorescent material and inorganic light-emitting diodes (ILEDs) using an inorganic material as a fluorescent material.

SUMMARY

Embodiments of the present disclosure provide a light-emitting element ink including a surfactant and thereby capable of reducing the surface tension of an ink including light-emitting elements.

Embodiments of the present disclosure also provide a display device capable of improving the dispersibility of light-emitting elements after printing by using the light-emitting element ink and a method of fabricating the display device.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, a light-emitting element ink including: a light-emitting element solvent, light-emitting elements dispersed in the light-emitting element solvent, each of the light-emitting elements including a plurality of semiconductor layers and an insulating film that surrounds parts of outer surfaces of the semiconductor layers, and a surfactant dispersed in the light-emitting element solvent, the surfactant including a fluorine-based and/or a silicon-based surfactant.

In an exemplary embodiment, the light-emitting element ink has a surface tension in a range of 28 dyn/cm to 38 dyn/cm.

In an exemplary embodiment, the light-emitting element ink forms a contact angle in a range of 23° to 27° with respect to a surface of a glass substrate.

In an exemplary embodiment, the surfactant has a critical surface tension in a range of 1 mN/m to 25 mN/m.

In an exemplary embodiment, the surfactant is included in an amount in a range of 0.01 to 1 part by weight based on 100 parts by weight of the light-emitting element ink.

In an exemplary embodiment, the light-emitting elements are included in an amount in a range of 0.01 to 1 part by weight based on 100 parts by weight of the light-emitting element ink.

According to an embodiment of the present disclosure, a method of fabricating a display device, including: preparing a light-emitting element ink, in which a plurality of light-emitting elements and a surfactant are dispersed in a light-emitting element solvent; preparing a target substrate, on which first and second electrodes are formed, spraying the light-emitting element ink onto the target substrate, settling the light-emitting elements on the first and second electrodes by generating an electric field on the target substrate, and removing the light-emitting element solvent.

In an exemplary embodiment, the preparing the light-emitting element ink includes preparing the light-emitting element ink via a primary dispersion process, including mixing the light-emitting elements and the light-emitting element solvent, and a secondary dispersion process, including adding the surfactant to a solution obtained by the primary dispersion process.

In an exemplary embodiment, the primary dispersion process further includes mixing a dispersant in the light-emitting element solvent, and the dispersant is included in the light-emitting element ink in an amount in a range of 10 to 50 parts by weight based on 100 parts by weight of the light-emitting elements.

In an exemplary embodiment, the removing the light-emitting element solvent is performed at a pressure in a range of $10^{-4}$ Torr to 1 Torr and at a temperature in a range of 25° C. to 150° C.

In an exemplary embodiment, the light-emitting element ink has a surface tension in a range of 28 dyn/cm to 38 dyn/cm.

In an exemplary embodiment, the light-emitting element ink forms a contact angle in a range of 23° to 27° with respect to a surface of a glass substrate.

In an exemplary embodiment, the surfactant has a critical surface tension in a range of 1 mN/m to 25 mN/m.

In an exemplary embodiment, the surfactant is included in the light-emitting element ink in an amount in a range of 0.01 to 1 part by weight based on 100 parts by weight of the light-emitting element ink.

In an exemplary embodiment, the light-emitting elements are included in an amount in a range of 0.01 to 1 part by weight based on 100 parts by weight of the light-emitting element ink.

In an exemplary embodiment, the settling the light-emitting elements includes settling first end portions of the light-emitting elements on the first electrode and second end portions of the light-emitting elements on the second electrode.

According to an embodiment of the present disclosure, a display device including: a substrate, a plurality of first banks extending in a first direction on the substrate and spaced apart from each other, first and second electrodes extending in the first direction and on different ones of the first banks spaced apart from each other, a first insulating layer on the substrate and covering parts of the first and second electrodes, a plurality of light-emitting elements on the first insulating layer such that both end portions of each of the light-emitting elements are respectively on the first and second electrodes, and a fluorine-based and/or a silicon-based surfactant on a surface of the first insulating layer.

In an exemplary embodiment, the surfactant is further on surfaces of the light-emitting elements.

In an exemplary embodiment, the display device further including: a first contact electrode on the first electrode such that the first contact electrode is in contact (e.g., physical contact) with first end portions of the light-emitting elements, and a second contact electrode on the second electrode such that the second contact electrode is in contact (e.g., physical contact) with second end portions of the light-emitting elements.

In an exemplary embodiment, each of the light-emitting elements includes a first semiconductor layer, a second semiconductor layer, and at least one light-emitting layer between the first and second semiconductor layers, and the first semiconductor layer, the second semiconductor layer, and the at least one light-emitting layer are surrounded by an insulating film.

According to the aforementioned and other embodiments of the present disclosure, because the light-emitting element ink includes a surfactant and is thereby capable of reducing the surface tension of ink including light-emitting elements, the light-emitting element ink can evenly spread.

In addition, the dispersibility of light-emitting elements can be improved after printing by using the light-emitting element ink.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

The subject matter of the present disclosure will now be described more fully hereinafter with reference to the accompanying drawings, in which example embodiments of the present disclosure are shown. The subject matter of this disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Embodiments of the present disclosure will hereinafter be described with reference to the accompanying drawings.

Figure 1:
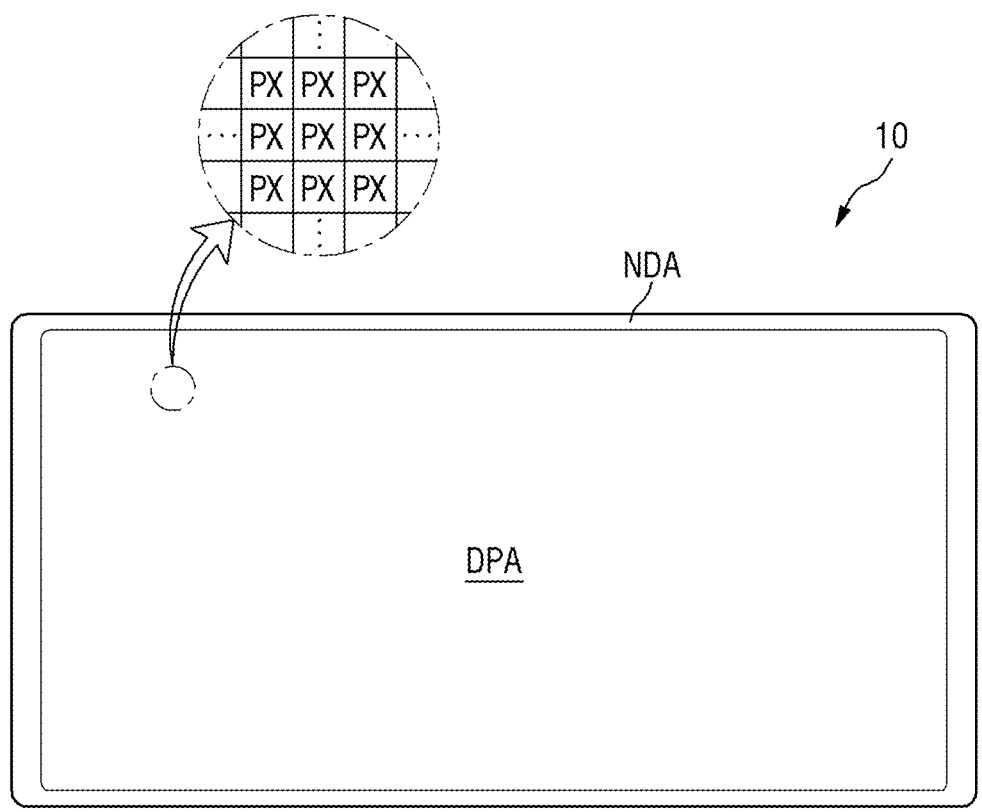
FIG. 1 is a plan view of a display device according to an embodiment of the present disclosure.
Figure 1:
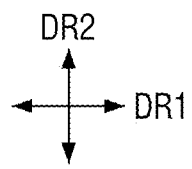

FIG. 1 is a plan view of a display device according to an embodiment of the present disclosure.

Referring to FIG. 1, a display device 10 displays a moving and/or a still image. The display device 10 may refer to nearly all types (or kinds) of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display screen. Examples of the display panel include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the present disclosure is not limited thereto.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a rectangular shape having rounded corners, another polygonal shape, or a circular shape. A display area DPA of the display device 10 may have a similar shape to the display device 10. FIG. 1 illustrates that the display device 10 and the display area DPA have a rectangular shape that extends longer in the horizontal direction than in the vertical direction, but the present disclosure is not limited thereto.

The display device 10 may include the display area DPA and a non-display area NDA. The display area DPA is an area in which a screen (e.g., an image) is displayed, and the non-display area NDA is an area in which a screen (e.g., an image) is not displayed (or is not designed to be displayed). The display area DPA may also be referred to as an active area, and the non-display area NDA may also be referred to as an inactive area. The display area DPA may generally account for a middle portion of the display device 10.

The display area DPA may include a plurality of pixels PX. The pixels PX may be arranged in row and column directions. The pixels PX may have a rectangular or square shape in a plan view, but the present disclosure is not limited thereto. In some embodiments, the pixels PX may have a rhombus shape that is inclined with respect to a set or particular direction. The pixels PX may be alternately arranged in a stripe fashion or a PENTILE® fashion (PENTILE® is a registered trademark of Samsung Display Co., Ltd.). Each of the pixels PX may include one or more light-emitting elements 30 that emit light of a set or predetermined wavelength range to emit light of a set or predetermined color.

The non-display area NDA may be on a periphery of the display area DPA. The non-display area NDA may surround the entire display area DPA or portion of the display area DPA. The display area DPA may have a rectangular shape, and the non-display area NDA may be adjacent to four sides of the display area DPA. The non-display area NDA may form the bezel of the display device 10. Wires or circuit drivers included in the display device 10 may be in the non-display area NDA, or external devices may be mounted in the non-display area NDA.

Figure 2:
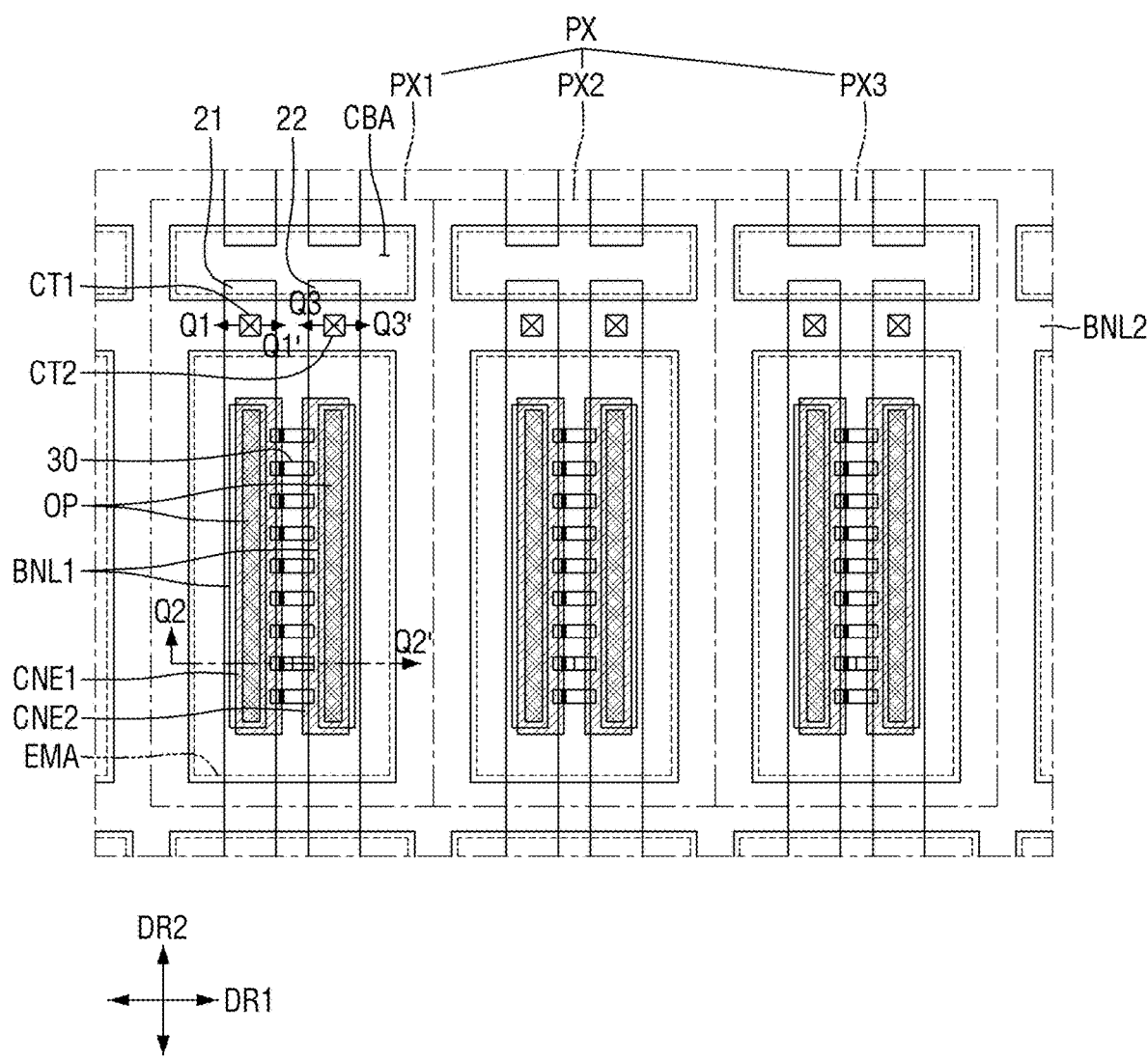
FIG. 2 is a plan view of a pixel of the display device of FIG. 1.

FIG. 2 is a plan view of a pixel of the display device of FIG. 1.

Referring to FIG. 2, a pixel PX may include a plurality of subpixels PXn (where n is an integer of 1 to 3). For example, the pixel PX may include first, second, and third subpixels PX1, PX2, and PX3. The first subpixel PX1 may emit light of a first color, the second subpixel PX2 may emit light of a second color, and the third subpixel PX3 may emit light of a third color. The first, second, and third colors may be blue, green, and red, respectively, but the present disclosure is not limited thereto. In some embodiments, the subpixels PXn may emit light of the same (e.g., substantially the same) color. FIG. 2 illustrates that the pixel PX includes three subpixels PXn, but the present disclosure is not limited thereto. In some embodiments, the pixel PX may include more than three subpixels PXn.

Each of the subpixels PXn may include an emission area EMA and a non-emission area. The emission area EMA may be an area in which one or more light-emitting elements 30 are included to emit light of a set or particular wavelength range, and the non-emission area may be an area that light emitted from the light-emitting elements 30 does not arrive at and no light is thus emitted from. The emission area EMA may include an area in which the light-emitting elements 30 are included, and an area that outputs light emitted from the light-emitting elements 30.

However, the present disclosure is not limited to this. The emission area EMA may further include an area in which light emitted from the light-emitting elements 30 is reflected or refracted by another element. A plurality of light-emitting elements 30 may be in the subpixels PXn, and a plurality of emission areas EMA, including areas where the plurality of light-emitting elements 30 are included and areas adjacent to the areas where the plurality of light-emitting elements 30 are included, may be formed.

Each of the subpixels PXn may include a cut area CBA, which is included in the non-emission area. The cut area CBA may be on one side, in a second direction DR2, of the emission area EMA. The cut area CBA may be between emission areas EMA of a pair of adjacent subpixels PXn in the second direction DR2. In the display area DPA of the display device 10, a plurality of emission areas EMA and a plurality of cut areas CBA may be arranged. For example, the plurality of emission areas EMA or the plurality of cut areas CBA may be arranged one after another in a first direction DR1, and the plurality of emission areas EMA or the plurality of cut areas CBA may be alternately arranged in the second direction DR2. A distance, in the first direction DR1, between the plurality of cut areas CBA may be smaller than a distance, in the first direction DR1, between the plurality of emission areas EMA. A second bank BNL2 may be between the plurality of cut areas CBA and the plurality of emission areas EMA, and the distance between the plurality of cut areas CBA and the plurality of emission areas EMA may vary depending on the width of the second bank BNL2. No light-emitting elements 30 are in the cut area CBA of each of the subpixels PXn so that no light is emitted from the cut area CBA of each of the subpixels PXn, but parts of electrodes (21 and 22) may be in the cut area CBA of each of the subpixels PXn to be separate from each other. The electrodes (21 and 22) may be cut and divided in the cut area CBA of each of the subpixels PXn.

Figure 3:
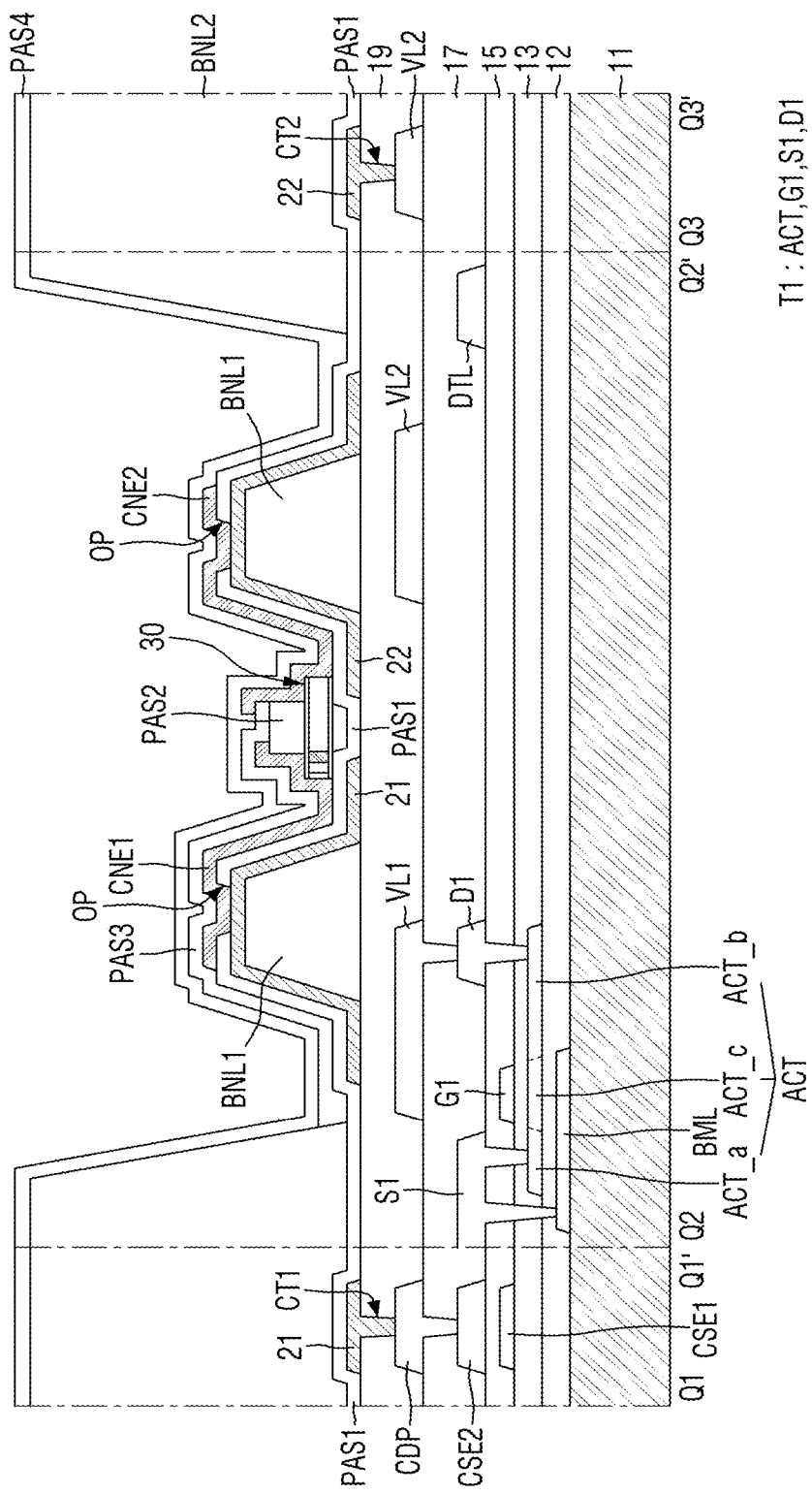
FIG. 3 is a cross-sectional view taken along lines Q1-Q1', Q2-Q2', and Q3-Q3' of FIG. 2.

FIG. 3 is a cross-sectional view taken along lines Q1-Q1', Q2-Q2', and Q3-Q3' of FIG. 2. FIG. 3 illustrates a cross-sectional view taken from one end portion to the other portion of one of the light-emitting elements 30 in the first subpixel PX1 of FIG. 2.

Referring to FIG. 3 and further to FIG. 2, the display device 10 may include a first substrate 11 and a semiconductor layer, a plurality of conductive layers, and a plurality of insulating layers, which are on the first substrate 11. The semiconductor layer, the conductive layers, and the insulating layers may form a circuit layer and a light-emitting element layer of the display device 10.

The first substrate 11 may be an insulating substrate. The first substrate 11 may be formed of an insulating material such as glass, quartz, and/or a polymer resin. Also, the first substrate 11 may be a rigid substrate, but may be a flexible substrate that is bendable, foldable, and/or rollable.

A light-blocking layer BML may be on the first substrate 11. The light-blocking layer BML may overlap with an active layer ACT of a first transistor T1. The light-blocking layer BML may include a material capable of blocking light (or reducing the transmission of light) and may thus prevent or reduce light from being incident upon the active layer ACT of the first transistor T1. For example, the light-blocking layer BML may be formed of an opaque metal capable of blocking or reducing the transmission of light, but the present disclosure is not limited thereto. In some embodiments, the light-blocking layer BML may not be provided.

A buffer layer 12 may be not only on the light-blocking layer BML, but also on the entire surface of the first substrate 11. The buffer layer 12 may be formed on the first substrate 11 to protect the first transistor T1 from moisture that may penetrate the first substrate 11, which is susceptible to moisture, and may perform a surface planarization function. The buffer 12 may include (e.g., consist of) a plurality of inorganic layers that are alternately stacked. For example, the buffer layer 12 may be formed as a multilayer film in which inorganic layers including at least one selected from silicon oxide ($SiO_x$), silicon nitride ($SiN_x$), and silicon oxynitride ($SiO_xN_y$) are alternately stacked.

The semiconductor layer may be on the buffer layer 12. The semiconductor layer may include the active layer ACT of the first transistor T1. The semiconductor layer may partially overlap with a gate electrode G1 in a first gate conductive layer.

FIG. 3 illustrates only the first transistor T1 of the first subpixel PX1, but the number of transistors included in the first subpixel PX1 is not particularly limited. The first subpixel PX1 may include more than one transistor. For example, the first subpixel PX1 may include more than one transistor including the first transistor T1, for example, two or three transistors.

The semiconductor layer may include polycrystalline silicon, monocrystalline silicon, and/or an oxide semiconductor. In a case where the semiconductor layer includes an oxide semiconductor, the active layer ACT may include a plurality of conductor regions (ACT_a and ACT_b) and a channel region ACT_c between the conductor regions (ACT_a and ACT_b). The oxide semiconductor may be an oxide semiconductor including indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), and/or indium gallium zinc tin oxide (IGZTO), but the present disclosure is not limited thereto.

In some embodiments, the semiconductor layer may include polycrystalline silicon, which is formed by crystallizing amorphous silicon. In this case, the conductor regions of the active layer ACT may be regions doped with impurities.

A first gate insulating layer 13 is on the semiconductor layer and the buffer layer 12. The first gate insulating layer 13 may be not only on the semiconductor layer, but also on the entire surface of the buffer layer 12. The first gate insulating layer 13 may function as the gate insulating film of each of the transistors of the first subpixel PX1. The first gate insulating layer 13 may be formed of an inorganic material such as, for example, $SiO_x$, $SiN_x$, and/or $SiO_xN_y$, as an inorganic layer or a stack of such inorganic layers.

The first gate conductive layer may be on the first gate insulating layer 13. The first gate conductive layer may include the gate electrode G1 of the first transistor T1 and a first capacitor electrode CSE1 of a storage capacitor. The gate electrode G1 may overlap with the channel region of the active layer ACT in a thickness direction. The first capacitor electrode CSE1 may overlap with a second capacitor electrode CSE2 in the thickness direction. The first capacitor electrode CSE1 may be coupled to, and integrally formed with, the gate electrode G1. The first capacitor electrode CSE1 may overlap with the second capacitor electrode CSE2 in the thickness direction so that the storage capacitor may be formed between the first capacitor electrode CSE1 and the second capacitor electrode CSE2.

The first gate conductive layer may be formed as a single- or multilayer film including at least one selected from molybdenum (Mo), aluminum (Al), chromium (Cr), gold (Au), titanium (Ti), nickel (Ni), neodymium (Nd), copper (Cu), and an alloy thereof, but the present disclosure is not limited thereto.

A first interlayer insulating layer 15 may be on the first gate conductive layer. The first interlayer insulating layer 15 may perform the functions of an insulating film between the first gate conductive layer and other layers thereon. A first interlayer insulating layer 15 may cover and protect the first gate conductive layer. The first interlayer insulating layer 15 may be formed of an inorganic material such as, for example, $SiO_x$, $SiN_x$, and/or $SiO_xN_y$, as an inorganic layer or a stack of such inorganic layers.

A first data conductive layer is on the first interlayer insulating layer 15. The first data conductive layer may include a first source electrode S1, a second drain electrode D1, a data line DTL, and the second capacitor electrode CSE2.

The first source electrode S1 and the first drain electrode D1 of the first transistor T1 may be in contact (e.g., physical contact) with the conductor regions (ACTa and ACTb) of the active layer ACT via contact holes that penetrate the first interlayer insulating layer 15 and the first gate insulating layer 13. The first source electrode S1 of the first transistor T1 may be electrically coupled to the light-blocking layer BML via another contact hole.

The data line DTL may transmit a data signal to the other transistors of the first subpixel PX1. In some embodiments, the data line DTL may be coupled to source/drain electrodes of the other transistors of the first subpixel PX1 and may thus transmit a signal applied thereto to the source/drain electrodes of the other transistors of the first subpixel PX1.

The second capacitor electrode CSE2 may overlap with the first capacitor electrode CSE1 in the thickness direction. For example, the second capacitor electrode CSE2 may be integrally formed with, and coupled to, the first source electrode S1.

The first data conductive layer may be formed as a single- or multilayer film including at least one selected from Mo, Al, Cr, Au, Ti, Ni, Nd, Cu, and an alloy thereof, but the present disclosure is not limited thereto.

The second interlayer insulating layer 17 may be on the first data conductive layer. The second interlayer insulating layer 17 may function as an insulating film between the first data conductive layer and layers on the first data conductive layer. Also, the second interlayer insulating layer 17 may cover and protect the first data conductive layer. The second interlayer insulating layer 17 may be formed of an inorganic material such as, for example, $SiO_x$, $SiN_x$, and/or $SiO_xN_y$, as an inorganic layer or a stack of such inorganic layers.

A second data conductive layer may be on the second interlayer insulating layer 17. The second data conductive layer may include a first voltage line VL1, a second voltage line VL2, and a first conductive pattern CDP. A high-potential voltage (or a first power supply voltage) provided to the first transistor T1 may be applied to the first voltage line VL1, and a low-potential voltage (or the second power supply voltage) provided to a second electrode 22 may be applied to the second voltage line VL2. Alignment signals for aligning the light-emitting elements 30 may be applied to the second voltage line VL2 during the fabrication of the display device 10.

The first conductive pattern CDP may be coupled to the second capacitor electrode CSE2 through a contact hole that is formed in the second interlayer insulating layer 17. The second capacitor electrode CSE2 may be integrally formed with the first source electrode S1, and the first conductive pattern CDP may be electrically coupled to the first source electrode S1. The first conductive pattern CDP may be in contact (e.g., physical contact) with a first electrode 21, and the first transistor T1 may transmit the first power supply voltage applied thereto from the first voltage line VL1 to the first electrode 21 via the first conductive pattern CDP. FIG. 3 illustrates that the second data conductive layer includes one first voltage line VL1 and one second voltage line VL2, but the present disclosure is not limited thereto. The second data conductive layer may include more than one first voltage line VL1 and more than one second voltage line VL2.

The second data conductive layer may be formed as a single- or multilayer film including at least one selected from Mo, Al, Cr, Au, Ti, Ni, Nd, Cu, and an alloy thereof, but the present disclosure is not limited thereto.

A first planarization layer 19 may be on the second data conductive layer. The first planarization layer 19 may include an organic insulating material such as polyimide (PI) and may perform a surface planarization function, but the present disclosure is not limited thereto.

A plurality of first banks BNL1, the electrodes (21 and 22), the light-emitting elements 30, a plurality of contact electrodes (CNE1 and CNE2), and the second bank BNL2 may be on the first planarization layer as elements of a display element layer. Also, a plurality of insulating layers (PAS1, PAS2, PAS3, and PAS4) may be disposed on the first planarization layer 19. The first banks BNL1 may be directly on the first planarization layer 19. The first banks BNL1 may extend in the second direction DR2 within the first subpixel PX1 and may be within the emission area EMA, instead of extending into neighboring subpixels PXn of the first subpixel PX1 in the second direction DR2. The first banks BNL1 may be spaced apart from each other in the first direction DR1, and the light-emitting elements 30 may be between the first banks BNL1. A plurality of first banks BNL1 may be provided in each of the subpixels PXn to form linear patterns. FIG. 3 illustrates that there are provided two first banks BNL1 in each of the subpixels PXn, but the number of first banks BNL1 is not particularly limited. In some embodiments, more than two first banks BNL1 may be provided depending on the number of electrodes (21 and 22).

The first banks BNL1 may protrude, at least in part, from the top surface of the first planarization layer 19. Parts of the first banks BNL1 that protrude may have inclined sides surfaces, and light emitted from the light-emitting elements 30 may be reflected by the electrodes (21 and 22) on the first banks BNL1 to be emitted in an upward direction from the first planarization layer 19. The first banks BNL1 may not only provide an area in which to arrange the light-emitting elements 30, but also function as a reflecting barrier capable of reflecting light emitted from the light-emitting elements 30 in the upward direction from the first planarization layer 19. The sides of the first banks BNL1 may be linearly inclined, but the present disclosure is not limited thereto. In some embodiments, the first banks BNL1 may have a semi-circular or elliptical shape having a curved outer surface. The first banks BNL1 may include an organic insulating material such as PI, but the present disclosure is not limited thereto.

The electrodes (21 and 22) may be on the first banks BNL1 and the first planarization layer 19. The electrodes (21 and 22) may include the first and second electrodes 21 and 22. The first and second electrodes 21 and 22 may extend in the second direction DR2 and may be spaced apart from each other in the first direction DR1.

The first and second electrodes 21 and 22 may extend in the second direction R2 in the first subpixel PX1 and may be cut and divided in the cut area CBA. For example, the cut area CBA of the first subpixel PX1 may be between the emission area EMA of the first subpixel PX1 and an emission area EMA of a neighboring subpixel PXn adjacent to the first subpixel PX1 in the second direction DR2, and the first and second electrodes 21 and 22 may be cut and divided in the cut area CBA, but the present disclosure is not limited thereto. In some embodiments, some of the electrodes (21 and 22) may extend beyond the first subpixel PX1, without being cut and divided in the cut area CBA, or only one of the first and second electrodes 21 and 22 may be cut and divided in the cut area CBA.

The first electrode 21 may be electrically coupled to the first transistor T1 via a first contact hole CT1, and the second electrode 22 may be electrically coupled to the second voltage line VL2 via a second contact hole CT2. For example, the first electrode 21 may be in contact (e.g., physical contact) with the first conductive pattern CDP through the first contact hole CT1, which penetrates the first planarization layer 19 in portion of the second bank BNL2 that extends in the first direction DR1, and the second electrode 22 may be in contact (e.g., physical contact) with the second voltage line VL2 through the second contact hole CT2, which penetrates the first planarization layer 19 in the portion of the second bank BNL2 that extends in the first direction DR1. However, the present disclosure is not limited to this example. In another example, the first and second contact holes CT1 and CT2 may be in the emission area EMA, which is surrounded by the second bank BNL2, not to overlap with the second bank BNL2.

FIGS. 2 and 3 illustrate that one first electrode 21 and one second electrode 22 are in each of the subpixels PXn, but the present disclosure is not limited thereto. For example, more than one first electrode 21 and more than one second electrode 22 may be provided in each of the subpixels PXn. The first and second electrodes 21 and 22 may not necessarily extend in only one direction, and the shape of the first and second electrodes 21 and 22 may vary. For example, the first and second electrodes 21 and 22 may be curved or bent in part, or one of the first and second electrodes 21 and 22 may surround the other electrode.

The first and second electrodes 21 and 22 may be directly on the first banks BNL1. The first and second electrodes 21 and 22 may be formed to have a greater width than the first banks BNL1. For example, the first and second electrodes 21 and 22 may cover the outer surfaces of the first banks BNL1. The first and second electrodes 21 and 22 may be on side surfaces of the first banks BNL1, and the distance between the first and second electrodes 21 and 22 may be smaller than the distance between the first banks BNL1. The first and second electrodes 21 and 22 may be, at least in part, directly on the first planarization layer 19 and may thus fall on the same plane. However, the present disclosure is not limited thereto. In some embodiments, the electrodes (21 and 22) may have a smaller width than the first banks BNL1. The electrodes (21 and 22) may cover at least one side surface of each of the first banks BNL1 and thus to reflect light emitted from the light-emitting elements 30.

The electrodes (21 and 22) may include a conductive material having high reflectance. For example, the electrodes (21 and 22) may include a metal having high reflectance such as silver (Ag), Cu, and/or Al, and/or may include an alloy of Al, Ni, and/or lanthanum (La). The electrodes (21 and 22) may reflect light, emitted from the light-emitting elements 30 to travel toward the sides of the first banks BNL1, in an upward direction from the first subpixel PX1.

However, the present disclosure is not limited to the above, and the electrodes (21 and 22) may further include a transparent conductive material. For example, the electrodes (21 and 22) may include a material such as ITO, IZO, and/or indium tin zinc oxide (ITZO). In some embodiments, each of the electrodes (21 and 22) may form a structure in which a transparent conductive material and a metal having high reflectance are stacked into more than one layer, or may be formed as a single layer including a transparent conductive material and a metal having high reflectance. For example, each of the electrodes (21 and 22) may have a stack of ITO/Ag/ITO, ITO, ITO/Ag/IZO, or ITO/Ag/ITZO/IZO.

The electrodes (21 and 22) may be electrically coupled to the light-emitting elements 30, and set or predetermined voltages may be applied to the electrodes (21 and 22) so that the light-emitting elements 30 may emit light. The electrodes (21 and 22) may be electrically coupled to the light-emitting elements 30 via the contact electrodes (CNE1 and CNE2) and may transmit electrical signals applied thereto to the light-emitting elements 30 via the contact electrodes (CNE1 and CNE2).

One of the first and second electrodes 21 and 22 may be electrically coupled to the anode electrodes of the light-emitting elements 30, and the other electrode may be electrically coupled to the cathode electrodes of the light-emitting elements 30. However, the present disclosure is not limited to the above. In some embodiments, one of the first and second electrodes 21 and 22 may be electrically coupled to the cathode electrodes of the light-emitting elements 30, and the other electrode may be electrically coupled to the anode electrodes of the light-emitting elements 30.

The electrodes (21 and 22) may be used to generate an electric field in the first subpixel PX1 to align the light-emitting elements 30. The light-emitting elements 30 may be arranged between the first and second electrodes 21 and 22 by an electric field generated on the first and second electrodes 21 and 22. The light-emitting elements 30 may be sprayed onto the electrodes (21 and 22) via inkjet printing. When an ink including the light-emitting elements 30 is sprayed on the electrodes (21 and 22), an electric field may be generated by applying alignment signals to the electrodes (21 and 22). The light-emitting elements 30 scattered in the ink may receive a dielectrophoretic force from the electric field and may thus be aligned on the electrodes (21 and 22) while their alignment directions and locations are changing.

A first insulating layer PAS1 may be on the first planarization layer 19. The first insulating layer PAS1 may cover the first banks BNL1 and the first and second electrodes 21 and 22. The first insulating layer PAS1 may protect the first and second electrodes 21 and 22 and may insulate the first and second electrodes 21 and 22 from each other. The first insulating layer PAS1 may prevent the light-emitting elements 30, which are on the first insulating layer PAS1, from being in direct contact (e.g., physical contact) with, and damaged by, other electrodes (or may reduce a likelihood or degree of such direct contact and/or damage).

For example, the first insulating layer PAS1 may include openings OP, which expose parts of the first and second electrodes 21 and 22. The openings OP may expose parts of the electrodes (21 and 22) that are on the top surfaces of the first banks BNL1. Parts of the contact electrodes (CNE1 and CNE2) may be in contact (e.g., physical contact) with the exposed parts of the electrodes (21 and 22) through the openings OP.

The first insulating layer PAS1 may be formed to have a top surface recessed, in part, between the first and second electrodes 21 and 22. Because the first insulating layer PAS1 covers the first and second electrodes 21 and 22, the first insulating layer PAS1 may be formed to be stepped between the first and second electrodes 21 and 22, but the present disclosure is not limited thereto.

As will be further described herein below, a surfactant may be on the surface of the first insulating layer PAS1. The surfactant may be included in light-emitting element ink having the light-emitting elements 30 scattered in a solvent thereof, and at least some of the surfactant may remain even after the removal of the solvent. At least some of the surfactant may remain on the surface of the first insulating layer PAS1, to which the light-emitting element ink is to be applied. For example, a fluorine (F)-based and/or a silicon (Si)-based surfactant may remain on the first insulating layer PAS1. At least some of the surfactant may also remain on the surfaces of the light-emitting elements 30. Because only a small amount of surfactant remains, the surfactant does not affect (or substantially does not affect) the operation of the display device 10.

The second bank BNL2 may be on the first insulating layer PAS1. In a plan view, the second bank BNL2 may include parts that extend in the first direction DR1 and parts that extend in the second direction DR2 and may thus be arranged in a lattice pattern. The second bank BNL2 may be located along the boundaries of each of the subpixels PXn to define each of the subpixels PXn.

Also, the second bank BNL2 may surround the emission area EMA and the cut area CBA of each of the subpixels PXn to separate the emission area EMA and the cut area CBA of each of the subpixels PXn. The first and second electrodes 21 and 22 may extend in the second direction DR2 across parts of the second bank BNL2 that extend in the first direction DR1. Parts of the second bank BNL2 that extend in the second direction DR2 may have a greater width between emission areas EMA than between cut areas CBA. Accordingly, the distance between cut areas CBA may be smaller than the distance between emission areas EMA.

The second bank BNL2 may be formed to have a greater height than the first banks BNL1. The second bank BNL2 may prevent or reduce spillover of ink between different subpixels PXn during an inkjet printing process performed as a portion of the fabrication of the display device 10 and may separate ink having the light-emitting elements 30 scattered therein between different subpixels PXn to prevent or reduce mixture of the ink. The second bank BNL2, similar to the first banks BNL1, may include PI, but the present disclosure is not limited thereto.

The light-emitting elements 30 may be on the first insulating layer PAS1. A plurality of light-emitting elements 30 may be spaced apart from one another in the direction in which the electrodes (21 and 22) extend, e.g., in the second direction DR2, and may be aligned substantially in parallel to one another. The light-emitting elements 30 may extend in one direction, and the direction in which the electrodes (21 and 22) extend may form substantially a right angle with the direction in which the light-emitting elements 30 extend. However, the present disclosure is not limited to this.

In some embodiments, the light-emitting elements 30 may be arranged not perpendicularly, but diagonally, with respect to the direction in which the electrodes (21 and 22) extend.

The light-emitting elements 30 may include light-emitting layers 36 (of FIG. 4), and the material of the light-emitting layers 36 of the light-emitting elements 30 may differ from one subpixel PXn to another subpixel PXn of each pixel PX so that different subpixels PXn of each pixel PX may emit light of different wavelength ranges. Accordingly, the first, second, and third subpixels PX1, PX2, and PX3 may emit light of the first, second, and third colors, respectively, but the present disclosure is not limited thereto. In some embodiments, different subpixels PXn of each pixel PX may include light-emitting elements of the same type (or kind) and may thus emit light of substantially the same color.

Both end portions of each of the light-emitting elements 30 may be on the electrodes (21 and 22). The length of the light-emitting elements 30 may be greater than the distance between the first and second electrodes 21 and 22, and both end portions of each of the light-emitting elements 30 may be on the first and second electrodes 21 and 22. For example, first end portions of the light-emitting elements 30 may be on the first electrode 21, and second end portions of the light-emitting elements 30 may be on the second electrode 22.

In each of the light-emitting elements 30, a plurality of layers may be arranged in a direction perpendicular (e.g., substantially perpendicular) to the top surface of the first substrate 11 or the top surface of the first planarization layer 19. The direction in which the light-emitting elements 30 extend may be parallel (e.g., substantially parallel) to the top surface of the first planarization layer 19, and a plurality of semiconductor layers included in each of the light-emitting elements 30 may be sequentially arranged in a direction parallel (e.g., substantially parallel) to the top surface of the first planarization layer 19. However, the present disclosure is not limited to the above. In some embodiments, the plurality of semiconductor layers may be arranged in the direction perpendicular (e.g., substantially parallel) to the top surface of the first planarization layer 19.

Both end portions of each of the light-emitting elements 30 may be in contact (e.g., physical contact) with the contact electrodes (CNE1 and CNE2). For example, an insulating film 38 (of FIG. 4) may not be formed at one end of each of the light-emitting elements 30 so that parts of semiconductor layers 31 and 32 (of FIG. 4) and/or an electrode layer 37 (of FIG. 4) of each of the light-emitting elements 30 may be exposed and may be in contact (e.g., physical contact) with the contact electrodes (CNE1 and CNE2), but the present disclosure is not limited thereto. In some embodiments, at least portion of the insulating film 38 may be removed so that the sides of the semiconductor layers 31 and 32 may be partially exposed. The exposed sides of the semiconductor layers 31 and 32 of each of the light-emitting elements 30 may be in direct contact (e.g., physical contact) with the contact electrodes (CNE1 and CNE2).

A second insulating layer PAS2 may be, in part, on the light-emitting elements 30. For example, the width of the second insulating layer PAS2 may be smaller than the length of the light-emitting elements 30, and the second insulating layer PAS2 may be on the light-emitting elements 30 to surround the light-emitting elements 30 and expose both end portions of each of the light-emitting elements. The second insulating layer PAS2 may initially cover the light-emitting elements 30, the electrodes (21 and 22), and the first insulating layer PAS1 during the fabrication of the display device 10 and may then be removed to expose both end portions of each of the light-emitting elements 30. The second insulating layer PAS2 may extend in the second direction DR2 over the first insulating layer PAS1, and thus, form a linear or island pattern in the first subpixel PX1 in a plan view. The second insulating layer PAS2 may protect the light-emitting elements 30 and may fix the light-emitting elements 30 during the fabrication of the display device 10.

The contact electrodes (CNE1 and CNE2) and a third insulating layer PAS3 may be on the second insulating layer PAS2.

The contact electrodes (CNE1 and CNE2) may extend in one direction and may be on the electrodes 21 and 22. The contact electrodes (CNE1 and CNE2) may include a first contact electrode CNE1, which is on the first electrode 21, and a second contact electrode CNE2, which is on the second electrode 22. The contact electrodes (CNE1 and CNE2) may be spaced apart from, and face, each other. For example, the first and second contact electrodes CNE1 and CNE2 may be on the first and second electrodes 21 and 22, respectively, to be spaced apart from each other in the first direction DR1. The contact electrodes (CNE1 and CNE2) may form stripe patterns in the emission area EMA of the first subpixel PX1.

The contact electrodes (CNE1 and CNE2) may be in contact (e.g., physical contact) with the light-emitting elements 30. The first contact electrode CNE1 may be in contact (e.g., physical contact) with the first end portions of the light-emitting elements 30, and the second contact electrode CNE2 may be in contact (e.g., physical contact) with the second end portions of the light-emitting elements 30. The semiconductor layers of each of the light-emitting elements 30 may be exposed at both ends of the corresponding light-emitting element 30, and the contact electrodes (CNE1 and CNE2) may be in contact (e.g., physical contact) with, and electrically coupled to, the semiconductor layers of each of the light-emitting elements 30. Sides of the contact electrodes (CNE1 and CNE2) that are in contact (e.g., physical contact) with both end portions of each of the light-emitting elements 30 may be on the second insulating layer PAS2. The first contact electrode CNE1 may be in contact (e.g., physical contact) with the first electrode 21 through an opening OP that exposes portion of the top surface of the first electrode 21, and the second contact electrode CNE2 may be in contact (e.g., physical contact) with the second electrode 22 through an opening OP that exposes portion of the top surface of the second electrode 22.

The width of the contact electrodes (CNE1 and CNE2) may be smaller than the width of the electrodes (21 and 22). The contact electrodes (CNE1 and CNE2) may be in contact (e.g., physical contact) with both end portions of each of the light-emitting elements 30 and cover parts of the top surfaces of the first and second electrodes 21 and 22, but the present disclosure is not limited thereto. In some embodiments, the contact electrodes (CNE1 and CNE2) may be formed to have a greater width than the electrodes (21 and 22) and thus to cover both sides of each of the electrodes (21 and 22).

The contact electrodes (CNE1 and CNE2) may include a transparent conductive material such as, for example, ITO, IZO, ITZO, and/or Al. Light emitted from the light-emitting elements 30 may travel toward the electrodes (21 and 22) through the contact electrodes (CNE1 and CNE2), but the present disclosure is not limited thereto.

FIGS. 2 and 3 illustrate that two contact electrodes (CNE1 and CNE2) are provided in each of the subpixels PXn, but the present disclosure is not limited thereto. The number of contact electrodes (CNE1 and CNE2) may vary depending on the number of electrodes (21 and 22) in each of the subpixels PXn.

The third insulating layer PAS3 may cover the first contact electrode CNE1. The third insulating layer PAS3 may cover not only the first contact electrode CNE1, but also a side of the second insulating layer PAS2 where the first contact electrode CNE1 is located. For example, the third insulating layer PAS3 may cover the first contact electrode CNE1 and the first insulating layer PAS1 on the first electrode 21. This type (or kind) of arrangement may be obtained by forming an insulating material layer for forming the third insulating layer PAS3 on the entire surface of the emission area EMA and partially removing the insulating material layer for forming the third insulating layer PAS3 to form the second contact electrode CNE2. In this process, the insulating material layer for forming the third insulating layer PAS3 may be removed together with an insulating material layer for forming the second contact electrode CNE2, and sides of the second and third insulating layers PAS2 and PAS3 may be aligned with each other. A side of the second contact electrode CNE2 may be on the third insulating layer PAS3, and the second contact electrode CNE2 may be insulated (e.g., electrically insulated) from the first contact electrode CNE1 by the third insulating layer PAS3.

A fourth insulating layer PAS4 may be on the entire surface of the display area DPA of the first substrate 11. The fourth insulating layer PAS4 may protect the elements on the first substrate 11 from an external environment. The fourth insulating layer PAS4 may not be provided.

The first, second, third, and fourth insulating layers PAS1, PAS2, PAS3, and PAS4 may include an inorganic insulating material and/or an organic insulating material. For example, the first, second, third, and fourth insulating layers PAS1, PAS2, PAS3, and PAS4 may include an inorganic insulating material such as $SiO_x$, $SiN_x$, $SiO_xN_y$, aluminum oxide ($Al_2O_3$), and/or aluminum nitride (AlN), but the present disclosure is not limited thereto. In another example, the first, second, third, and fourth insulating layers PAS1, PAS2, PAS3, and PAS4 may include an organic insulating material such as an acrylic resin, an epoxy resin, a phenolic resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, and/or a polymethyl methacrylate-polycarbonate synthetic resin, but the present disclosure is not limited thereto.

Figure 4:
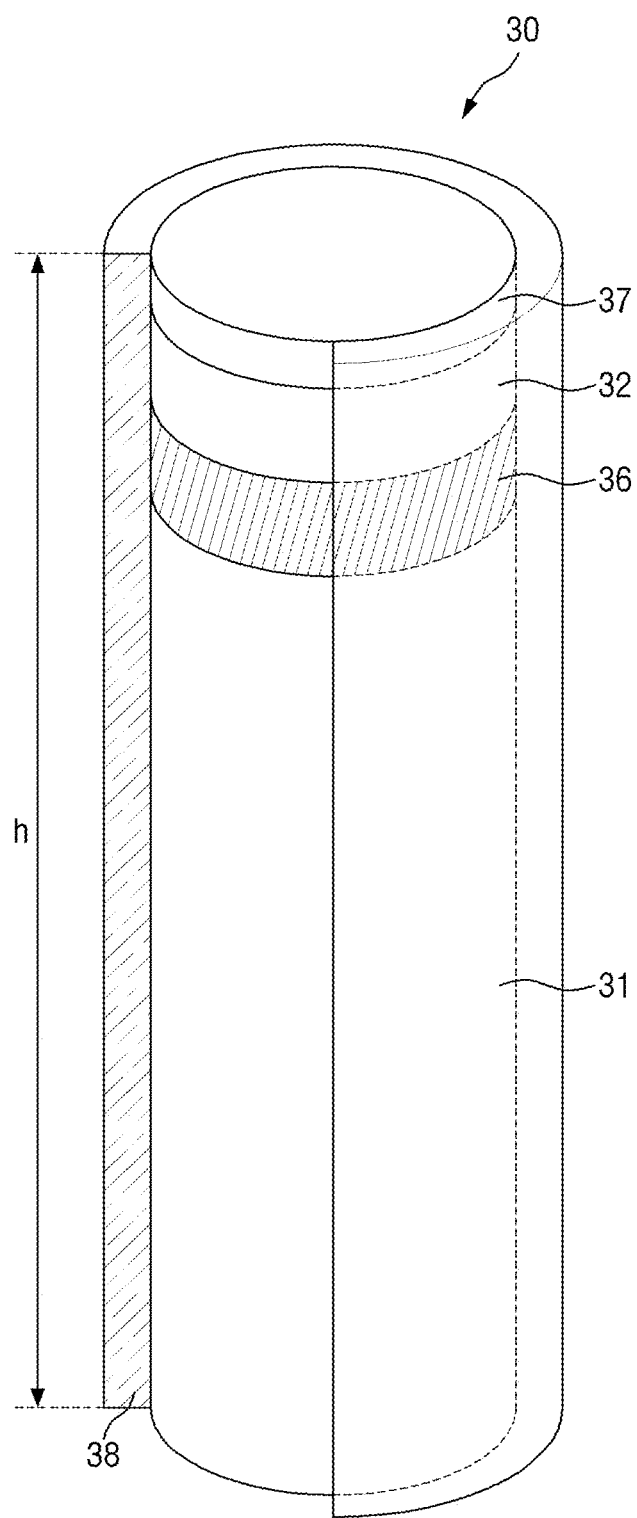
FIG. 4 is a perspective view of a light-emitting element according to an embodiment of the present disclosure.

FIG. 4 is a perspective view of a light-emitting element according to an embodiment of the present disclosure.

Referring to FIG. 4, a light-emitting element 30 may be a light-emitting diode (LED), for example, an ILED having a size of several micrometers or nanometers and formed of an inorganic material. If an electric field is formed in a set or particular direction between two opposite electrodes, the ILED may be aligned between the two electrodes where polarities are formed. The light-emitting element 30 may be aligned by the electric field formed between the two electrodes.

The light-emitting element 30 may have a shape that extends in one direction. The light-emitting element 30 may have the shape of a cylinder, a rod, a wire, or a tube, but the shape of the light-emitting element 30 is not particularly limited. In some embodiments, the light-emitting element 30 may have the shape of a polygonal column such as a regular cube, a rectangular parallelepiped, or a hexagonal column or may have a shape that extends in one direction but with a partially inclined outer surface. A plurality of semiconductors included in the light-emitting element 30 may be sequentially arranged or stacked in the direction in which the light-emitting element 30 extends.

The light-emitting element 30 may include semiconductor layers doped with impurities of a set or arbitrary conductivity type (e.g., a p-type or an n-type). The semiconductor layers may receive electrical signals from an external power source to emit light of a set or particular wavelength range.

Referring to FIG. 4, the light-emitting element 30 may include a first semiconductor layer 31, a second semiconductor layer 32, a light-emitting layer 36, an electrode layer 37, and an insulating film 38.

The first semiconductor layer 31 may include an n-type semiconductor. In a case where the light-emitting element 30 emits light of a blue wavelength range, the first semiconductor layer 31 may include a semiconductor material $Al_xGa_yIn_{1-x-y}N$ (where $0 \le x \le 1, 0 \le y \le 1$, and $0 \le x+y \le 1$). The semiconductor material $Al_xGa_yIn_{1-x-y}N$ may be at least one selected from AlGaInN, GaN, AlGaN, InGaN, AlN, and InN that are doped with an n-type dopant. The first semiconductor layer 31 may be doped with an n-type dopant, and the n-type dopant may be Si, Ge, and/or Sn. For example, the first semiconductor layer 31 may be n-GaN doped with n-type Si. The first semiconductor layer 31 may have a length in a range of 1.5 μm to 5 μm, but the present disclosure is not limited thereto.

The second semiconductor layer 32 may be on the light-emitting layer 36. The second semiconductor layer 32 may include a p-type semiconductor. In a case where the light-emitting element 30 emits light of a blue or green wavelength range, the second semiconductor layer 32 may include a semiconductor material $Al_xGa_yIn_{1-x-y}N$ (where $0 \le x \le 1, 0 \le y \le 1$, and $0 \le x+y \le 1$). For example, the semiconductor material $Al_xGa_yIn_{1-x-y}N$ may be at least one selected from AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, and/or Ba. For example, the second semiconductor layer 32 may be p-GaN doped with p-type Mg. The second semiconductor layer 32 may have a length in a range of 0.05 μm to 0.10 μm, but the present disclosure is not limited thereto.

FIG. 3 illustrates that the first and second semiconductor layers 31 and 32 are formed as single-layer films, but the present disclosure is not limited thereto. In some embodiments, each of the first and second semiconductor layers 31 and 32 may include more than one layer such as, for example, a clad layer and/or a tensile strain barrier reducing (TSBR) layer, depending on the material of the light-emitting layer 36.

The light-emitting layer 36 may be between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN and/or AlGaInN. In some embodiments, in a case where the light-emitting layer 36 has a multi-quantum well structure in which multiple quantum layers and multiple well layers are alternately stacked, the quantum layers may include a material such as AlGaN and/or AlGaInN, and the well layers may include a material such as GaN or AlInN. For example, in a case where the light-emitting layer 36 includes AlGaInN as its quantum layer(s) and AlInN as its well layer(s), the light-emitting layer 36 can emit blue light having a central wavelength range of 450 nm to 495 nm.

However, the present disclosure is not limited to this. In some embodiments, the light-emitting layer 36 may have a structure in which a semiconductor material having a large band gap energy and a semiconductor material having a small band gap energy are alternately stacked or may include group III or group V semiconductor materials depending on the wavelength of light to be emitted. The type (or kind) of light emitted by the light-emitting layer 36 is not particularly limited. The light-emitting layer 36 may emit light of a red or green wavelength range as necessary, instead of blue light. The light-emitting layer 36 may have a length in a range of 0.05 μm to 0.10 μm, but the present disclosure is not limited thereto.

Light may be emitted not only from a peripheral or circumferential surface, in a length direction, of the light-emitting element 30, but also from both sides of the light-emitting element 30. The directionality of the light emitted from the light-emitting layer 36 is not particularly limited.

The electrode layer 37 may be an ohmic contact electrode, but the present disclosure is not limited thereto. In some embodiments, the electrode layer 37 may be a Schottky contact electrode (e.g., a semiconductor diode formed by the junction of a semiconductor and a metal). The light-emitting element 30 may include at least one electrode layer 37. FIG. 4 illustrates that the light-emitting element 30 includes one electrode layer 37, but the present disclosure is not limited thereto. In some embodiments, the light-emitting element 30 may include more than one electrode layer 37, or the electrode layer 37 may not be provided. However, the following description of the light-emitting element 30 may also be directly applicable to a light-emitting element 30 having more than one electrode layer 37 or having a different structure from the light-emitting element 30 of FIG. 4.

The electrode layer 37 may reduce the resistance between the light-emitting element 30 and electrodes (or contact electrodes) when the light-emitting element 30 is electrically coupled to the electrodes (or the contact electrodes). The electrode layer 37 may include a conductive metal (e.g., an electrically conductive metal). For example, the electrode layer 37 may include at least one selected from Al, Ti, In, Au, Ag, ITO, IZO, and ITZO. Also, the electrode layer 37 may include a semiconductor material doped with an n-type or p-type dopant. The electrode layer 37 may include the same material or different materials, but the present disclosure is not limited thereto.

The insulating film 38 may surround the first and second semiconductor layers 31 and 32 and the electrode layer 37. For example, the insulating film 38 may surround at least the light-emitting layer 36 and may extend in the direction in which the light-emitting element 30 extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but to expose both end portions, in the length direction, of the light-emitting element 30.

FIG. 3 illustrates that the insulating film 38 is formed to extend in the length direction of the light-emitting element 30 and to cover the sides of the first semiconductor layer 31, the light-emitting layer 36, the second semiconductor layer 32, and the electrode layer 37, but the present disclosure is not limited thereto. The insulating film 38 may cover the sides of only the light-emitting layer 36 and some of the first and second semiconductor layers 31 and 32 or may cover only portion of the side of the electrode layer 37 so that the side of the electrode layer 37 may be partially exposed. The insulating film 38 may be formed to be rounded in a cross-sectional view, in a region adjacent to at least one end of the light-emitting element 30.

The insulating film 38 may have a thickness of 10 nm to 1.0 µm, but the present disclosure is not limited thereto. In some embodiments, the insulating film 38 may have a thickness of about 40 nm.

The insulating film 38 may include a material with insulating properties (e.g., electrically insulating properties) such as, for example, $SiO_x$, $SiN_x$, $SiO_xN_y$, AlN, and/or $Al_2O_3$. Accordingly, the insulating film 38 can prevent any short circuit that may occur when the light-emitting layer 36 is placed in direct contact (e.g., physical contact) with electrodes that transmit electrical signals directly to the light-emitting element 30 (or may reduce a likelihood or degree of such a short circuit). Also, because the insulating film 38 includes the light-emitting layer 36 to protect the outer surface of the light-emitting element 30, any degradation (or substantially any degradation) in the emission efficiency of the light-emitting element 30 can be prevented or reduced.

The outer surface of the insulating film 38 may be subjected to surface treatment. The light-emitting element 30 may be sprayed on electrodes while being scattered in a set or predetermined ink. Here, the surface of the insulating film 38 may be hydrophobically or hydrophilically treated to keep the light-emitting element 30 scattered in ink without agglomerating with other neighboring light-emitting elements 30. For example, the insulating film 38 may be surface-treated with a material such as stearic acid and/or 2,3-naphthalene dicarboxylic acid.

A length h of the light-emitting element 30 may be in a range of 1 µm to 10 µm or 2 µm to 6 µm, for example, 3 µm to 5 µm. The light-emitting element 30 may have a diameter in a range of 30 nm to 700 nm and may have an aspect ratio in a range of 1.2 to 100, but the present disclosure is not limited thereto. Different light-emitting elements 30 included in the display device 10 may have different diameters depending on the composition of their respective light-emitting layers 36. In some embodiments, the light-emitting element 30 may have a diameter of about 500 nm.

The shape and the material of the light-emitting element 30 are not particularly limited. In some embodiments, the light-emitting element 30 may include more layers than those illustrated in FIG. 4 or may have a different shape from that illustrated in FIG. 4.

Figure 5:
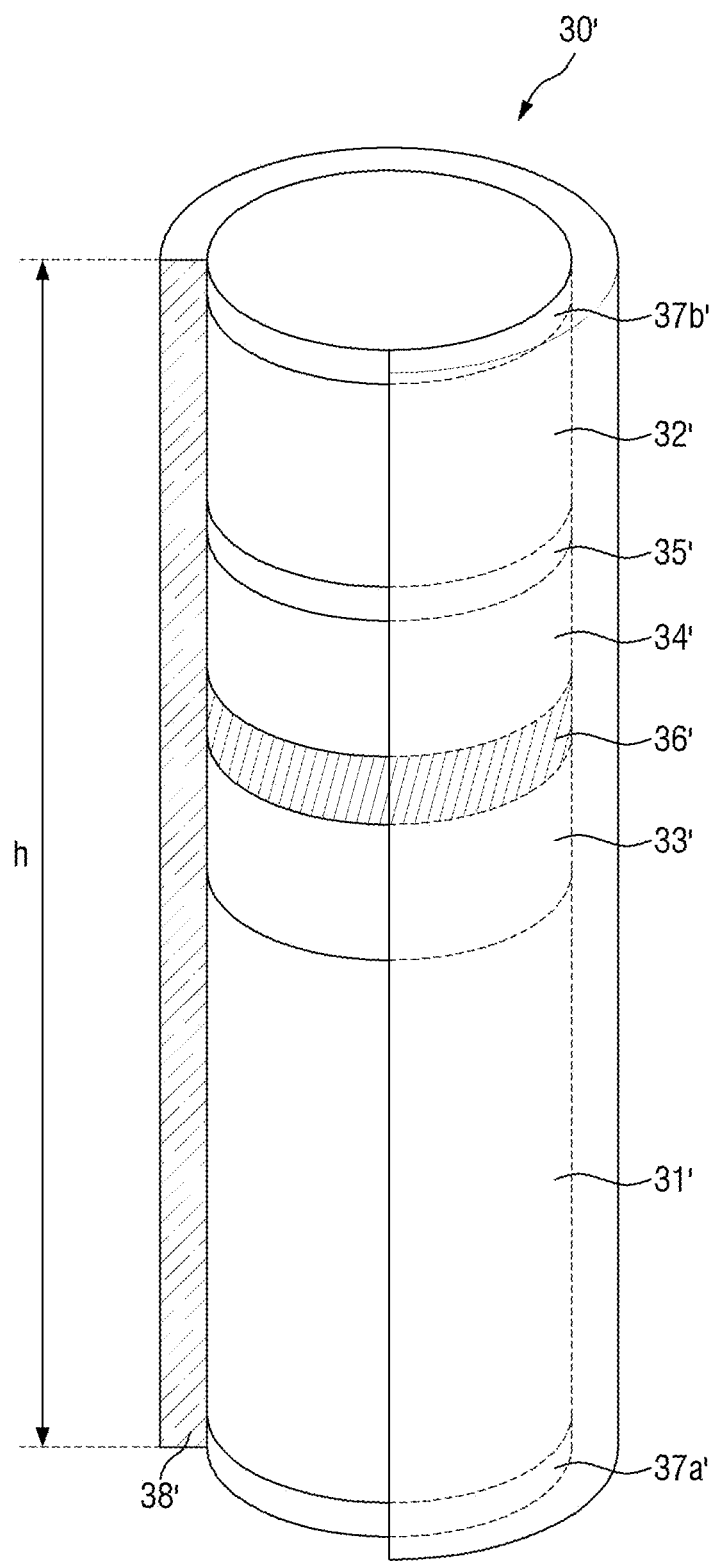
FIGS. 5 and 6 are perspective views of light-emitting elements according to other embodiments of the present disclosure.
Figure 6:
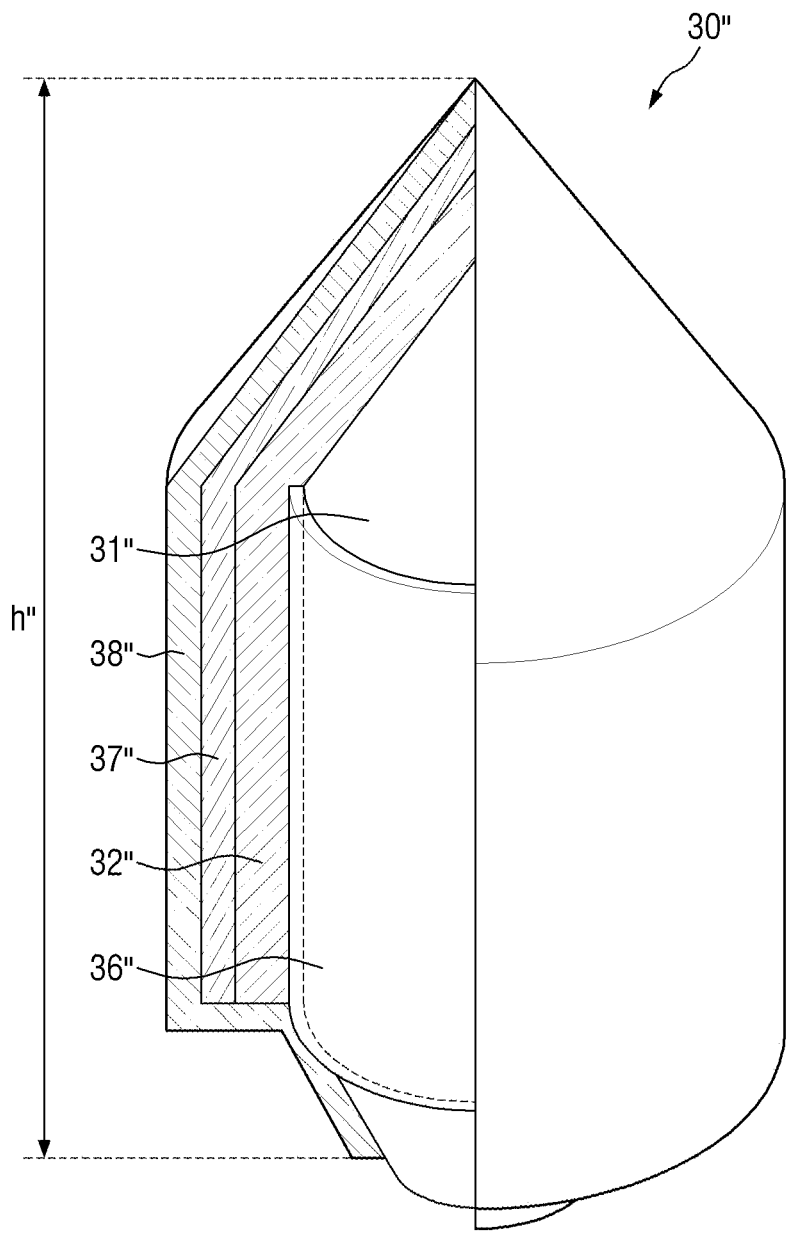

FIGS. 5 and 6 are perspective views of light-emitting elements according to other embodiments of the present disclosure.

Referring to FIG. 5, a light-emitting element 30' may include a first semiconductor layer 31', a second semiconductor layer 32', and a light-emitting layer 36' and may further include a third semiconductor layer 33', which is between the first semiconductor layer 31' and the light-emitting layer 36', and fourth and fifth semiconductor layers 34' and 35', which are between the light-emitting layer 36' and the second semiconductor layer 32'. The light-emitting element 30' may include an insulating film 38' at least partially surrounding the first semiconductor layer 31', the second semiconductor layer 32', the third semiconductor layer 33', the fourth and fifth semiconductor layers 34' and 35', and the light-emitting layer 36'. The light-emitting element 30' differs from the light-emitting element 30 of FIG. 4 in that it includes a plurality of semiconductor layers (33', 34', and 35') and a plurality of electrode layers (37a' and 37b'), and that the light-emitting layer 36' includes a different element or material from the light-emitting layer 36 of FIG. 4. The light-emitting element 30' will hereinafter be described, focusing mainly on the differences with the light-emitting element 30 of FIG. 4.

The light-emitting layer 36 of the light-emitting element 30 of FIG. 4 may include nitrogen (N) and may thus emit blue or green light. In some embodiments, the light-emitting layer 36' and the semiconductor layers (33', 34', and 35') of the light-emitting element 30' of FIG. 5 may include a semiconductor that contains at least phosphorus (P). The light-emitting element 30' may emit red light having a central wavelength range of 620 nm to 750 nm. However, the central wavelength range of the red light is not particularly limited and may be understood as encompassing all wavelength ranges that can be perceived as red light.

In some embodiments, the first semiconductor layer 31' may be an n-type semiconductor layer including a semiconductor material $In_xAl_yGa_{1-x-y}P$ (where $0\le x\le 1$, $0\le y\le 1$, and $0\le x+y\le 1$). The first semiconductor layer 31' may include at least one selected from InAlGaP, GaP, AlGaP, InGaP, AlP, and InP that are doped with an n-type dopant. For example, the first semiconductor layer 31' may be n-AlGaInP doped with n-type Si.

The second semiconductor layer 32' may be a p-type semiconductor layer including a semiconductor material $In_xAl_yGa_{1-x-y}P$ (where $0\le x\le 1$, $0\le y\le 1$, and $0\le x+y\le 1$). The second semiconductor layer 32' may include at least one selected from InAlGaP, GaP, AlGaNP, InGaP, AlP, and InP that are doped with a p-type dopant. For example, the second semiconductor layer 32' may be p-GaP doped with p-type magnesium (Mg).

The light-emitting layer 36' may be between the first and second semiconductor layers 31' and 32'. The light-emitting layer 36' may include a single- or multi-quantum well structure material and may thus emit light of a set or particular wavelength range. In a case where the light-emitting layer 36' has a structure in which a quantum layer and a well layer are alternately stacked to form a multi-quantum well structure, the quantum layer may include a material such as AlGaP and/or AlInGaP, and the well layer may include a material such as GaP and/or AlInP. For example, the light-emitting layer 36' may include AlGaInP as the quantum layer and AlInP as the well layer and may thus emit red light having a central wavelength range of 620 nm to 750 nm.

The light-emitting element 30' may further include clad layers, which are adjacent to the light-emitting layer 36'. The third and fourth semiconductor layers 33' and 34', which are between the first and second semiconductor layers 31' and 32', above or below the light-emitting layer 36', may be clad layers.

The third semiconductor layer 33' may be between the first semiconductor layer 31' and the light-emitting layer 36'. The third semiconductor layer 33', similar to the first semiconductor layer 31', may be an n-type semiconductor layer and may include a semiconductor material $In_xAl_yGa_{1-x-y}P$ (where $0\le x\le 1$, $0\le y\le 1$, and $0\le x+y\le 1$). For example, the first semiconductor layer 31' may include n-AlGaInP, and the third semiconductor layer 33' may include n-AlInP. However, the present disclosure is not limited to this example.

The fourth semiconductor layer 34' may be between the light-emitting layer 36' and the second semiconductor layer 32'. The fourth semiconductor layer 34' may include a semiconductor material $In_xAl_yGa_{1-x-y}P$ (where $0\le x\le 1$, $0\le y\le 1$, and $0\le x+y\le 1$). For example, the second semiconductor layer 32' may include p-GaP, and the fourth semiconductor layer 34' may include p-AlInP.

The fifth semiconductor layer 35' may be between the second and fourth semiconductor layers 32' and 34'. The fifth semiconductor layer 35', similar to the second and fourth semiconductor layers 32' and 34', may be a p-type semiconductor layer. In some embodiments, the fifth semiconductor layer 35' may reduce the difference in lattice constant between the second and fourth semiconductor layers 32' and 34'. The fifth semiconductor layer 35' may be a tensile strain barrier reducing (TSBR) layer. For example, the fifth semiconductor layer 35' may include p-GaInP, p-AlInP, and/or p-AlGaInP, but the present disclosure is not limited thereto. The third, fourth, and fifth semiconductor layers 33', 34', and 35' may have a length in a range of 0.08 μm to 0.25 μm, but the present disclosure is not limited thereto.

First and second electrode layers 37a' and 37b' may be on the first and second semiconductor layers 31' and 32'. The first electrode layer 37a' may be on the bottom surface of the first semiconductor layer 31', and the second electrode layer 37b' may be on the top surface of the second semiconductor layer 32'. However, the present disclosure is not limited to this, and at least one of the first and second electrode layers 37a' and 37b' may not be omitted. For example, the first electrode layer 37a' may not be on the bottom surface of the first semiconductor layer 31', and only the second electrode layer 37b' may be on the top surface of the second semiconductor layer 32'.

Referring to FIG. 6, a light-emitting element 30" may extend in one direction and may be inclined in part. For example, the light-emitting element 30" may have a conical shape in part.

In the light-emitting element 30", a plurality of layers may be formed to surround one another, instead of being stacked in one direction. The light-emitting element 30" may have a height h" and may include a semiconductor core, which extends in one direction, and an insulating film 38", which is formed to surround the semiconductor core. The semiconductor core may include a first semiconductor layer 31", a light-emitting layer 36", a second semiconductor layer 32", and an electrode layer 37".

The first semiconductor layer 31" may extend in one direction and may be inclined toward the center of the light-emitting element 30" at both ends thereof. The first semiconductor layer 31" may include a main body portion, which has a rod- or cylindrical shape, and upper and lower end portions, which are formed at the top and the bottom of the main body portion to be inclined. The upper end portion may be steeper than the lower end portion.

The light-emitting layer 36" may surround the outer surface of the main body portion of the first semiconductor layer 31". The light-emitting layer 36" may have a ring shape that extends in one direction. The light-emitting layer 36" may not be formed on the upper and lower end portions of the first semiconductor layer 31", but the present disclosure is not limited thereto. Light emitted from the light-emitting layer 36" may be output not only through both ends, in the length direction, of the light-emitting element 30", but also through the side surface of the light-emitting element 30". The light-emitting element 30" may have a wider light-emitting layer 36" than the light-emitting element 30 of FIG. 4 and may thus emit a larger amount of light than the light-emitting element 30 of FIG. 4.

The second semiconductor layer 32" may surround the outer surface of the light-emitting layer 36" and the upper end portion of the first semiconductor layer 31". The second semiconductor layer 32" may include a main body portion, which has a ring shape that extends in one direction, and an upper end portion, which is formed to be inclined. For example, the second semiconductor layer 32" may be in direct contact (e.g., physical contact) with the side surface of the light-emitting layer 36" and the upper end portion of the first semiconductor layer 31". However, the second semiconductor layer 32" may not be formed on the lower end portion of the first semiconductor layer 31".

The electrode layer 37" may surround the outer surface of the second semiconductor layer 32". The shape of the electrode layer 37" may be substantially the same as the second semiconductor layer 32". The electrode layer 37" may be in contact (e.g., physical contact) with the entire outer surface of the second semiconductor layer 32".

The insulating film 38" may surround the outer surfaces of the electrode layer 37" and the first semiconductor layer 31". The insulating film 38" may be in direct contact (e.g., physical contact) not only with the electrode layer 37", but also with the lower end portion of the first semiconductor layer 31", the light-emitting layer 36", and the exposed lower end of the second semiconductor layer 32".

In some embodiments, referring again to FIGS. 2 and 3, the light-emitting elements 30 may be sprayed onto the electrodes (21 and 22) via inkjet printing. The light-emitting elements 30 may be dispersed in a solvent to be prepared in an ink state and may then be sprayed onto the electrodes (21 and 22). Then, as alignment signals are applied to the electrodes (21 and 22), the light-emitting elements 30 may be arranged between the electrodes (21 and 22). Once the alignment signals are applied to the electrodes (21 and 22), an electric field may be generated on the electrodes (21 and 22), and the light-emitting elements 30 may receive a dielectrophoretic force from the electric field and may be aligned on the electrodes (21 and 22) while their alignment directions and locations are changing.

There may arise an error in the location at which to drop ink (hereinafter, the light-emitting element ink) including the light-emitting element 30, which are sprayed via inkjet printing, depending on the performance of an inkjet printer and/or the physical properties of the light-emitting element ink. In this case, a drop of the light-emitting element ink may be dropped off-centered in each of the subpixels PXn, for example, the first subpixel PX1. The light-emitting element ink has a set or predetermined surface tension, and the first insulating layer PAS1 (of FIG. 3) may protrude depending on the surface tension of the light-emitting element ink. If the surface tension of the light-emitting element ink is less than the surface tension of the first insulating layer PAS1, the light-emitting element ink may properly spread between parts of the second bank BNL2 (of FIG. 3) so that the light-emitting elements 30 may be evenly distributed. On the contrary, if the surface tension of the light-emitting element ink is greater than the surface tension of the first insulating layer PAS1, the light-emitting element ink may not properly spread but may fall off-centered, for example, when the error arises in the location at which to drop the light-emitting element ink. As a result, the light-emitting elements 30 may also be arranged off-centered so that the luminance of the first subpixel PX1 may become non-uniform.

The light-emitting element ink may include a surfactant 500 (of FIG. 7) so that the surface tension of the light-emitting element ink may decrease. The surface tension of the light-emitting element ink may be the same as, or less than, the surface tension of the first insulating layer PAS1. Accordingly, even if the error arises in the location at which to drop the light-emitting element ink, the light-emitting element ink still can evenly spread between parts of the second bank BNL2, and as a result, the light-emitting elements 30 can be evenly distributed.

Embodiments of a light-emitting element ink will hereinafter be described.

Figure 7:
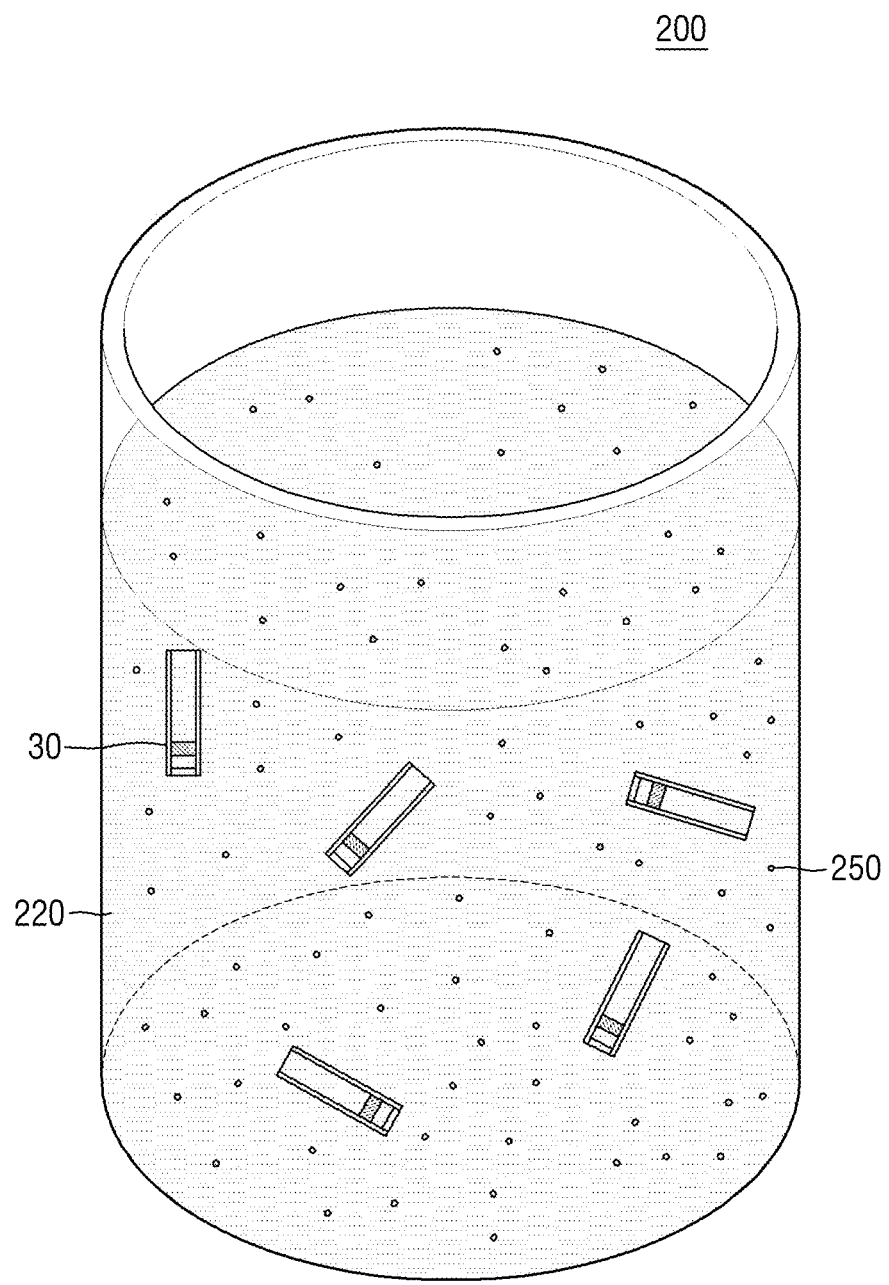
FIG. 7 is a perspective view of light-emitting element ink according to an embodiment of the present disclosure.

FIG. 7 is a perspective view of light-emitting element ink according to an embodiment of the present disclosure.

Referring to FIG. 7, light-emitting element ink 200 may include a light-emitting element solvent 220, light-emitting elements 30, which are scattered in the light-emitting element solvent 220, and a surfactant 250. Each of the light-emitting elements 30 may be one of the light-emitting elements 30, 30', and 30" of FIGS. 4, 5, and 6, for example, the light-emitting element 30 of FIG. 4, and thus, a duplicative description thereof will not be repeated here. Instead, the light-emitting element solvent 220 and the surfactant 250 primarily will hereinafter be described.

The light-emitting element solvent 220 may be stored having, scattered therein, the light-emitting elements 30, each including semiconductor layers, and may be an organic solvent that does not react (or substantially does not react) with the light-emitting elements 30. The light-emitting element solvent 220 may have such a viscosity that it can be discharged through the nozzles of an inkjet printing device in its liquid state. The solvent molecules of the light-emitting element solvent 220 may surround and scatter the light-emitting elements 30. The light-emitting element ink 200 may be prepared in a solution or colloidal state including the light emitting device 30.

The light-emitting element solvent 220 may be acetone, water, alcohol, toluene, propylene glycol (PG), propylene glycol methyl acetate (PGMA), triethylene glycol monobutyl ether (TGBE), diethylene glycol monophenyl ether (DGPE), an amide solvent, a dicarbonyl solvent, diethylene glycol dibenzoate, tricarbonyl solvent, triethyl citrate, a phthalate-based solvent, benzyl butyl phthalate, bis(2-ethylhexyl) phthalate, bis(2-ethylhexyl) isophthalate, and/or ethyl phthalyl ethyl glycolate, but the present disclosure is not limited thereto.

The surfactant 250 may be dispersed in the light-emitting element solvent 220 together with the light-emitting elements 30. The surfactant 250 is included in the light-emitting element ink 200 to reduce the surface tension of the light-emitting element ink 200 and increase the smoothness of the light-emitting element ink 200 (e.g., to improve the viscosity and/or flow of the light-emitting element ink 200). The surfactant 250 may reduce the surface energy of the interface between the light-emitting element ink 200 and a first insulating layer PAS1 to which the light-emitting element ink 200 is to be applied. When the light-emitting element ink 200 is applied on the first insulating layer PAS1, the surfactant 250 may be adjacent to the first insulating layer PAS1 so that the surface energy at the interface between the first insulating layer PAS1 and the light-emitting element ink 200 may decrease.

The surface tension of the light-emitting element ink 200 may be in a range of 28 dyn/cm to 37 dyn/cm, but the present disclosure is not limited thereto. The surface tension of the light-emitting element ink 200 may be adjusted in accordance with the surface tension of the layer onto which the light-emitting element ink 200 is to be sprayed. For example, the surface tension of the light-emitting element ink 200 may be the same as, or less than, the surface tension of the layer onto which the light-emitting element ink 200 is to be sprayed. Because the light-emitting element ink 200 is sprayed onto the first insulating layer PAS1, the surface tension of the light-emitting element ink 200 may be the same as, or less than, the surface tension of the first insulating layer PAS1.

When the surface tension of the light-emitting element ink 200 is in the aforementioned range, the light-emitting element ink 200 may have a set or predetermined contact angle. The light-emitting element ink 200 may have (e.g., may form) a contact angle in a range of 23° to 27° with respect to the surface of a glass substrate. When the contact angle of the light-emitting element ink 200 is 23° or greater, overflow of the light-emitting element ink 200 out of the second bank BNL2 of FIG. 3 can be prevented or reduced. When the contact angle of the light-emitting element ink 200 is 27° or smaller, the light-emitting element ink 200 can spread widely between parts of the second bank BNL2.

The surfactant 250, which is included in the light-emitting element ink 200, may be a F-based and/or a Si-based surfactant.

The F-based surfactant may have 1 to 16 carbon atoms, or, for example, 4 to 16 carbon atoms, per molecule to which the F atom is bonded. The F-based surfactant may be, for example, trifluoromethyl, tetrafluoroethylene, a perfluoroalkyl sulfonic acid compound, a perfluoroalkyl carboxylic acid compound, a perfluoroalkyl phosphate ester compound, a perfluoroalkyl ethylene oxide compound, and/or a polyoxyalkylene ether polymer having a perfluoroalkyl ether group. Examples of the perfluoroalkyl sulfonic acid compound include perfluoroalkyl sulfonic acid and perfluoroalkyl sulfonate. Examples of the perfluoroalkyl carboxylic acid compound include perfluoroalkyl carboxylic acid and perfluoroalkyl carboxylate. Examples of the perfluoroalkyl phosphate ester compound include perfluoroalkyl phosphate ester and perfluoroalkyl phosphate ester salt. Examples of the polyoxyalkylene ether polymer having a perfluoroalkyl ether group include a polyoxyalkylene ether polymer having a perfluoroalkyl ether group on the side chain thereof and sulfate ester salt or salt of a polyoxyalkylene ether polymer having a perfluoroalkyl ether group on the side chain thereof.

The Si-based surfactant may be a polysiloxane compound such as, for example, a polysiloxane-modified polysiloxane compound, a polyester-modified polysiloxane compound, a polyether-modified hydroxy-functional polysiloxane compound, an amine-modified polysiloxane compound, and/or an epoxy-modified polysiloxane compound.

The critical surface tension of trifluoromethyl, which is an exemplary F-based surfactant, is 6 mN/m, and the critical surface tension of tetrafluoroethylene, which is another exemplary F-based surfactant, may be 18.5 mN/m. The critical surface tension of siloxane, which is an exemplary Si-based surfactant, may be 24 mN/m. By using a surfactant having a critical surface tension in a range of 1 mN/m to 25 mN/m from among the aforementioned surfactants, the light-emitting element ink 200 can be made to evenly spread between parts of the second bank BNL2.

The light-emitting element ink 200 may contain a set or particular amount of the light-emitting elements 30 per unit weight thereof, and the surfactant 250 may be contained in a set or particular amount with respect to the weight of the light-emitting element ink 200.

The light-emitting element ink 200 may include 0.01 to 1 part by weight of the surfactant 250 with respect to 100 parts by weight of the light-emitting element ink 200. If the light-emitting element ink 200 contains 0.01 (or greater) parts by weight of the surfactant 250 with respect to 100 parts by weight of the light-emitting element ink 200, the surface tension of the light-emitting element ink 200 may be lowered so that the light-emitting element ink 200 may properly spread. If the light-emitting element ink 200 contains 1 or (less) part by weight of the surfactant 250 with respect to 100 parts by weight of the light-emitting element ink 200, overflow of the light-emitting element ink 200 out of the second bank BNL2 between different subpixels PXn when being dropped may be prevented or reduced, and as a result, deterioration of processability may be prevented or reduced. As the light-emitting element ink 200 contains the surfactant 250 in the aforementioned range, the light-emitting element ink 200 can evenly spread in each subpixel PXn.

The content of the light-emitting elements 30 in the light-emitting element ink 200 may vary depending on the number of light-emitting elements 30 per unit droplet of the light-emitting element ink 200 ejected through a nozzle during printing. For example, the light-emitting elements 30 may be contained in an amount in a range of 0.01 to 1 part by weight based on 100 parts by weight of the light-emitting element ink 200, but the present disclosure is not limited thereto. The content of the light-emitting elements 30 may vary depending on the number of light-emitting elements 30 per unit droplet of the light-emitting element ink 200.

The light-emitting element ink 200 may further include a dispersant, which improves the dispersibility of the light-emitting elements 30. The type (or kind) of the dispersant is not particularly limited, and a suitable or appropriate amount of dispersant may be added to the light-emitting element ink 200 to further disperse the light-emitting elements 30. For example, 10 to 50 parts by weight of the dispersant may be contained relative to 100 parts by weight of the light-emitting elements 30, but the present disclosure is not limited thereto.

When a product including the light-emitting elements 30 is fabricated using the light-emitting element ink 200, a uniform number of light-emitting elements 30 may be arranged per unit area, and in a subsequent process, the light-emitting element solvent 220 may be completely removed. However, at least some of the surfactant 250 may remain unremoved. The display device 10 of FIGS. 1 through 3 can be fabricated using the light-emitting element ink 200.

During the fabrication of the display device 10, the light-emitting elements 30 may be arranged on the electrodes (21 and 22) via printing using the light-emitting element ink 200.

The fabrication of the display device 10 will hereinafter be described.

Figure 8:
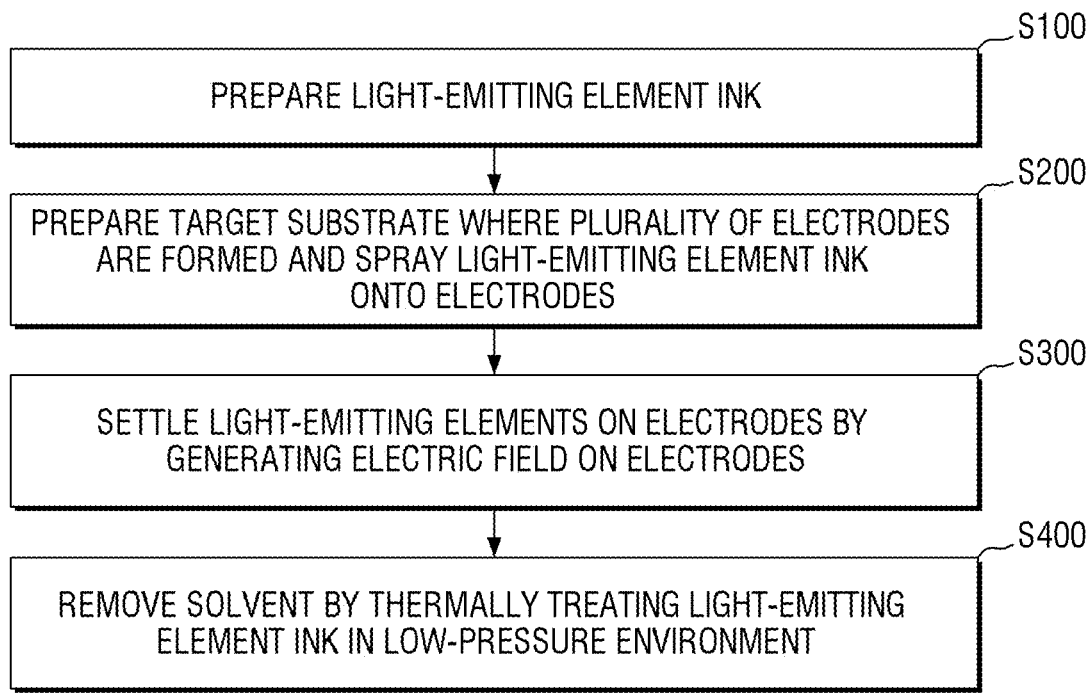
FIG. 8 is a flowchart illustrating a method of fabricating a display device according to an embodiment of the present disclosure.

FIG. 8 is a flowchart illustrating a method of fabricating a display device according to an embodiment of the present disclosure.

Referring to FIG. 8, the method may include: preparing light-emitting element ink 200, which includes light-emitting elements 30, a light-emitting element solvent 220, and a surfactant 250 (S100); preparing a target substrate SUB where a plurality of electrodes (21 and 22) are formed and spraying the light-emitting element ink 200 onto the electrodes (21 and 22) (S200); settling the light-emitting elements 30 on the electrodes (21 and 22) by generating an electric field on the electrodes (21 and 22) (S300); and removing the light-emitting element solvent 220 by thermally treating the light-emitting element ink 200 in a low-pressure environment (S400).

The method of FIG. 8 will hereinafter be described in more detail with reference to FIGS. 9 through 15.

FIGS. 9 through 12 are cross-sectional views illustrating active acts of the method of FIG. 8.

Figure 9:
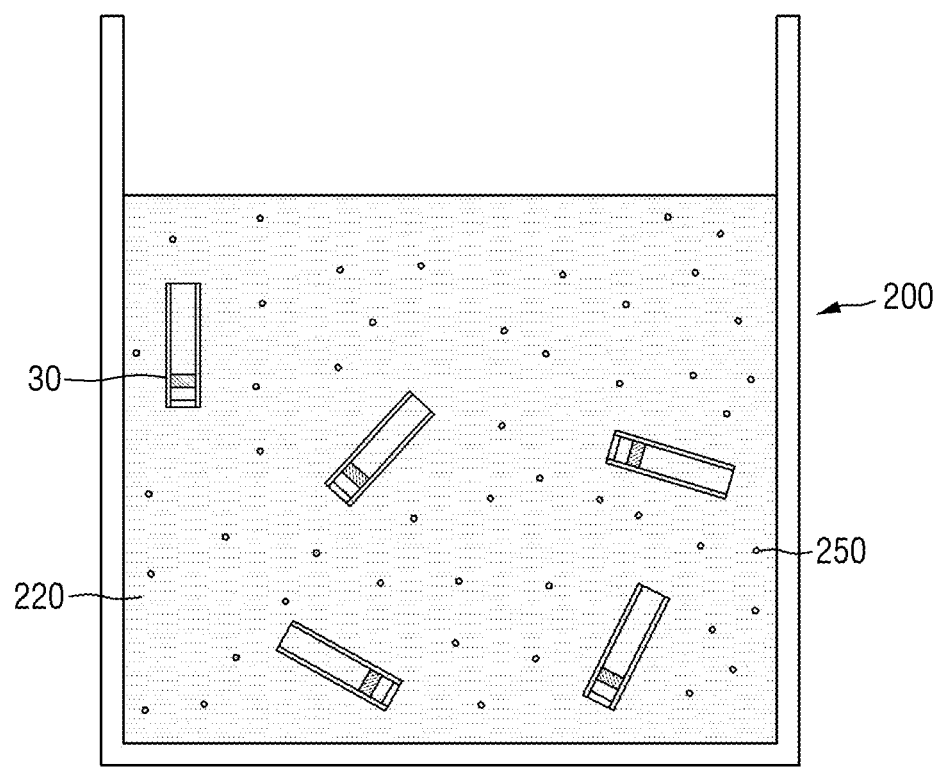
FIGS. 9 through 12 are cross-sectional views illustrating active acts of the method of FIG. 8.
Figure 10:
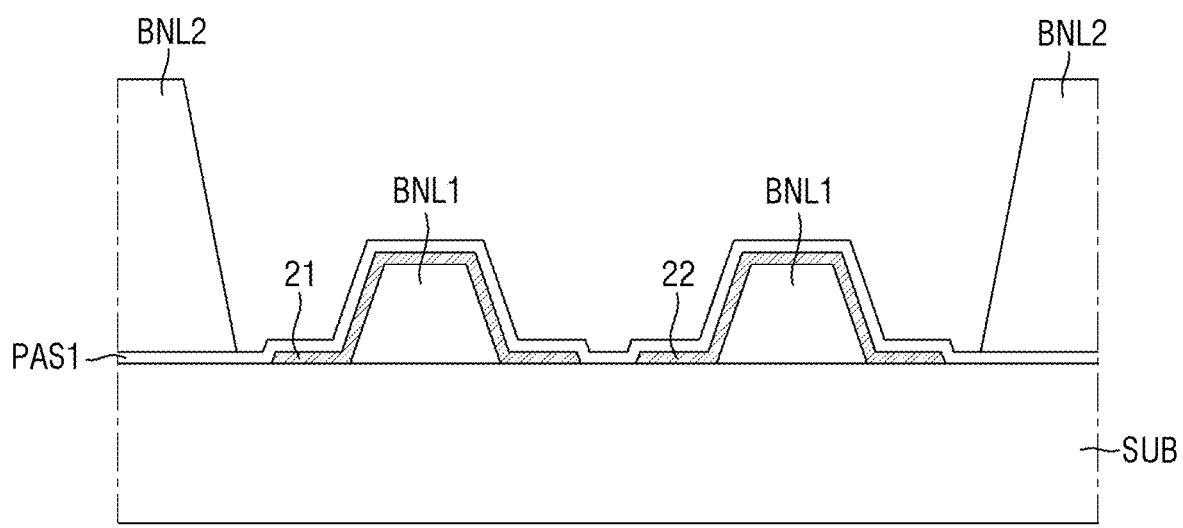

Referring to FIGS. 9 and 10, light-emitting element ink 200, which includes light-emitting elements 30, a light-emitting element solvent 220, and a surfactant 250, and a target substrate SUB, on which first and second electrodes 21 and 22, a first insulating layer PAS1, and first bank BNL1 are included, are prepared. FIGS. 9 and 10 illustrate that a pair of electrodes (21 and 22) are provided on the target substrate SUB, but more than one pair of electrodes (21 and 22) may be provided on the target substrate SUB. The target substrate SUB may include the first substrate 11 of the display device 10 and a plurality of circuit elements, which are on the first substrate 11. For convenience, duplicative descriptions and illustrations of the first substrate 11 and the circuit elements will not be repeated here.

The light-emitting element ink 200 may include the solvent 220 and the light-emitting elements 30 and the surfactant 250, which are scattered or dispersed in the solvent 220. The surfactant 250 may be evenly dispersed in the solvent 220. The surface tension of the light-emitting element ink 200 including the surfactant 250 may be in a range of 28 dyn/cm to 38 dyn/cm and may maintain the light-emitting elements 30 to be dispersed for a long period of time.

The preparation of the light-emitting element ink 200 may be performed by a primary dispersion process, which is a process of mixing the light-emitting elements 30, the light-emitting element 220, and a dispersant and a secondary dispersion process, which is a process of adding the surfactant 250 to the solution obtained by the primary dispersion process.

The primary dispersion process may be performed by mixing the light-emitting elements 30 and the dispersant into the light-emitting element solvent 220 for more than five minutes. The light-emitting elements 30 may have a diameter in a range of 1 µm or less or about 500 nm and a length in a range of 1 µm to 10 µm or about 4 µm. The light-emitting elements 30 may be contained in an amount in a range of 0.01 to 1 part by weight based on 100 parts by weight of the light-emitting element ink 200, and the dispersant may be contained in an amount in a range of 10 to 50 parts by weight based on 100 parts by weight of the light-emitting elements 30. The mixing of the light-emitting elements 30, the light-emitting element 220, and the dispersant may be performed by sonication, stirring, and/or milling.

Thereafter, the secondary dispersion process, which adds the surfactant 250 to the solution obtained by the first dispersion process and mixes them together, is performed. The surfactant 250 may be contained in an amount in a range of 0.01 to 1 part by weight based on 100 parts by weight of the light-emitting element ink 200. The mixing of the surfactant 250 and the solution obtained by the primary dispersion process may be performed by sequentially performing sonication and steering for five minutes each. Also, to properly mix the surfactant 250, the mixing of the surfactant 250 and the solution obtained by the primary dispersion process may be performed at a temperature higher than room temperature (e.g., 25° C.), for example, at about 40° C. If an exact formulation is difficult because of the high viscosity of the surfactant 250 or the addition of only a small amount of surfactant 250, a primary surfactant solution may be produced by mixing 1 to 10 parts by weight of the surfactant 250 with 100 parts by weight of a solvent. Then, the primary surfactant solution may be diluted and may then be added to the light-emitting element ink 200.

The light-emitting element ink 200 obtained by the primary and secondary dispersion processes may be stored at room temperature (e.g., 25° C.). The surfactant 250 of the light-emitting element ink 200 may be evenly dispersed with the light-emitting element solvent 220 and the light-emitting elements 30, and due to the presence of the surfactant 250, the light-emitting element ink 200 may have a surface tension in a range of 28 dyn/cm to 37 dyn/cm. The light-emitting elements 30 may be maintained to be dispersed almost without precipitation.

Figure 11:
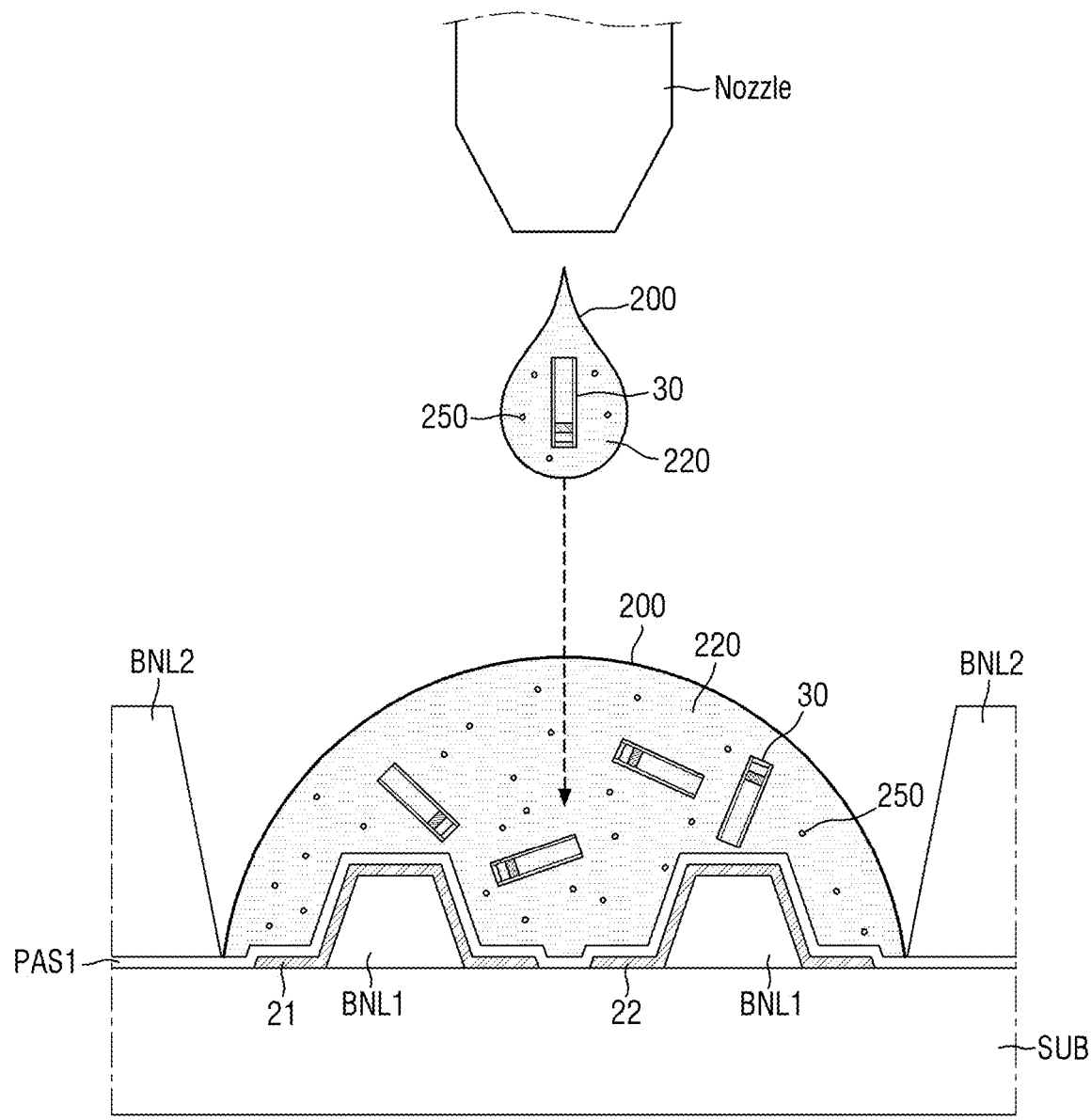
Figure 12:
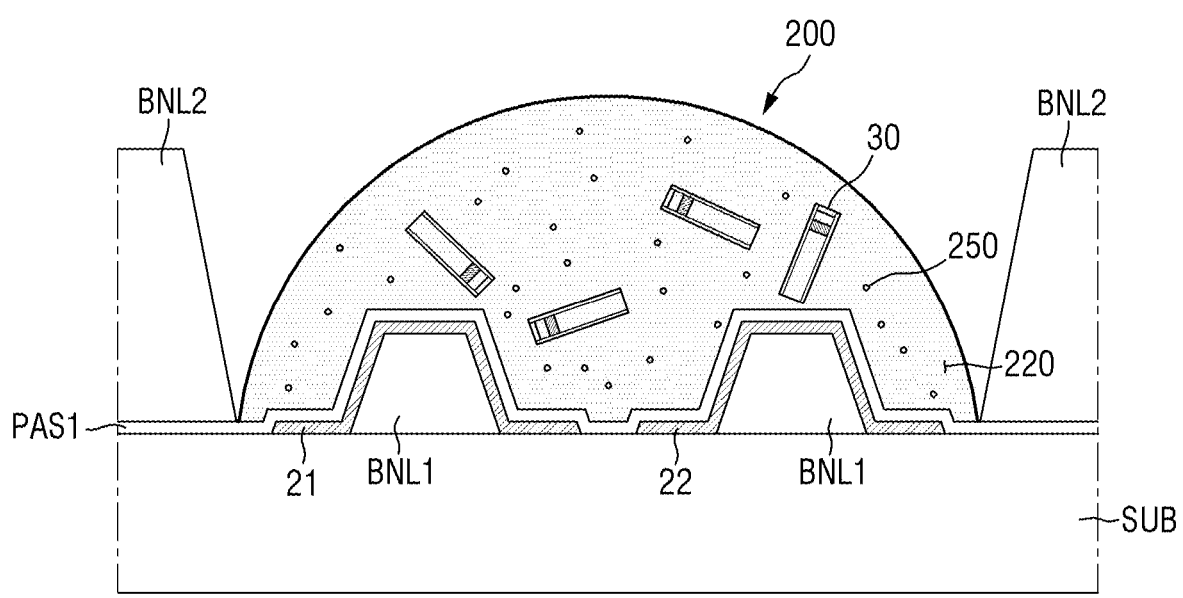

Thereafter, referring to FIGS. 11 and 12, the light-emitting element ink 200 is sprayed on the first insulating layer PAS1, which covers the first and second electrodes 21 and 22 on the target substrate SUB. The light-emitting element ink 200 may be sprayed onto the first insulating layer PAS1 via printing by an inkjet printing device. The light-emitting element ink 200 may be sprayed through the nozzles of an inkjet head of the inkjet printing device. The light-emitting element ink 200 may flow along an internal flow path provided in the inkjet head and may then be ejected onto the target substrate SUB through the nozzles. The light-emitting element ink 200 ejected from the nozzles may be settled on the target substrate SUB, for example, on the first insulating layer PAS1 where the first and second electrodes 21 and 22 are formed. The light-emitting elements 30 may extend in one direction and may be scattered in the light-emitting element ink 200 in random alignment directions.

Once the light-emitting element ink 200 is sprayed onto the first insulating layer PAS1, the light-emitting element ink 200 may evenly spread over a second bank BNL2 due to the surfactant 250. Because the surface tension of the light-emitting element ink 200 is in a range of 28 dyn/cm to 37 dyn/cm, overflow of the light-emitting element ink 200 out of the second bank BNL2 can be prevented or reduced and can evenly spread between parts of the second bank BNL2. As a result, the light-emitting elements 30 scattered in the light-emitting element ink 200 can be evenly distributed between parts of the second bank BNL2.

Thereafter, the light-emitting elements 30 are settled on the first and second electrodes 21 and 22 (S300) by generating an electric field in the light-emitting element ink 200, and the light-emitting element solvent 220 is removed (S400).

Figure 13:
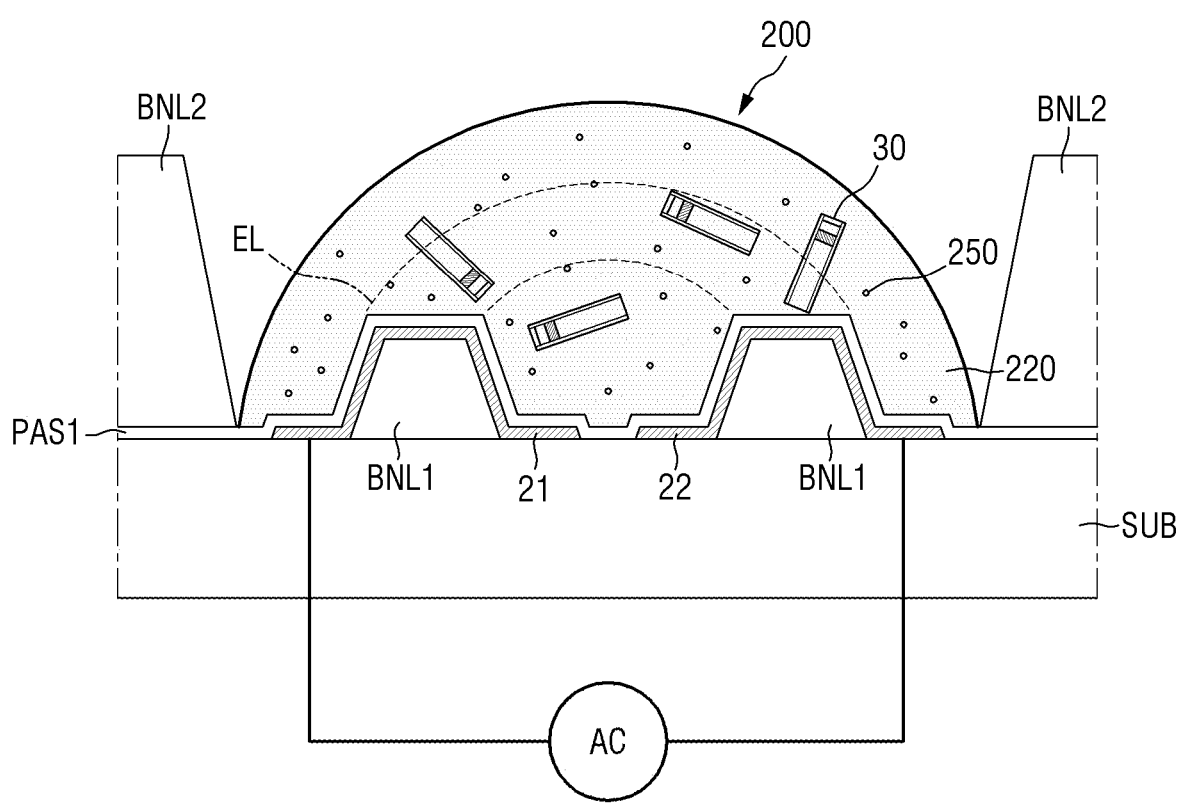
FIGS. 13 through 15 are cross-sectional views illustrating other active acts of the method of FIG. 8.
Figure 14:
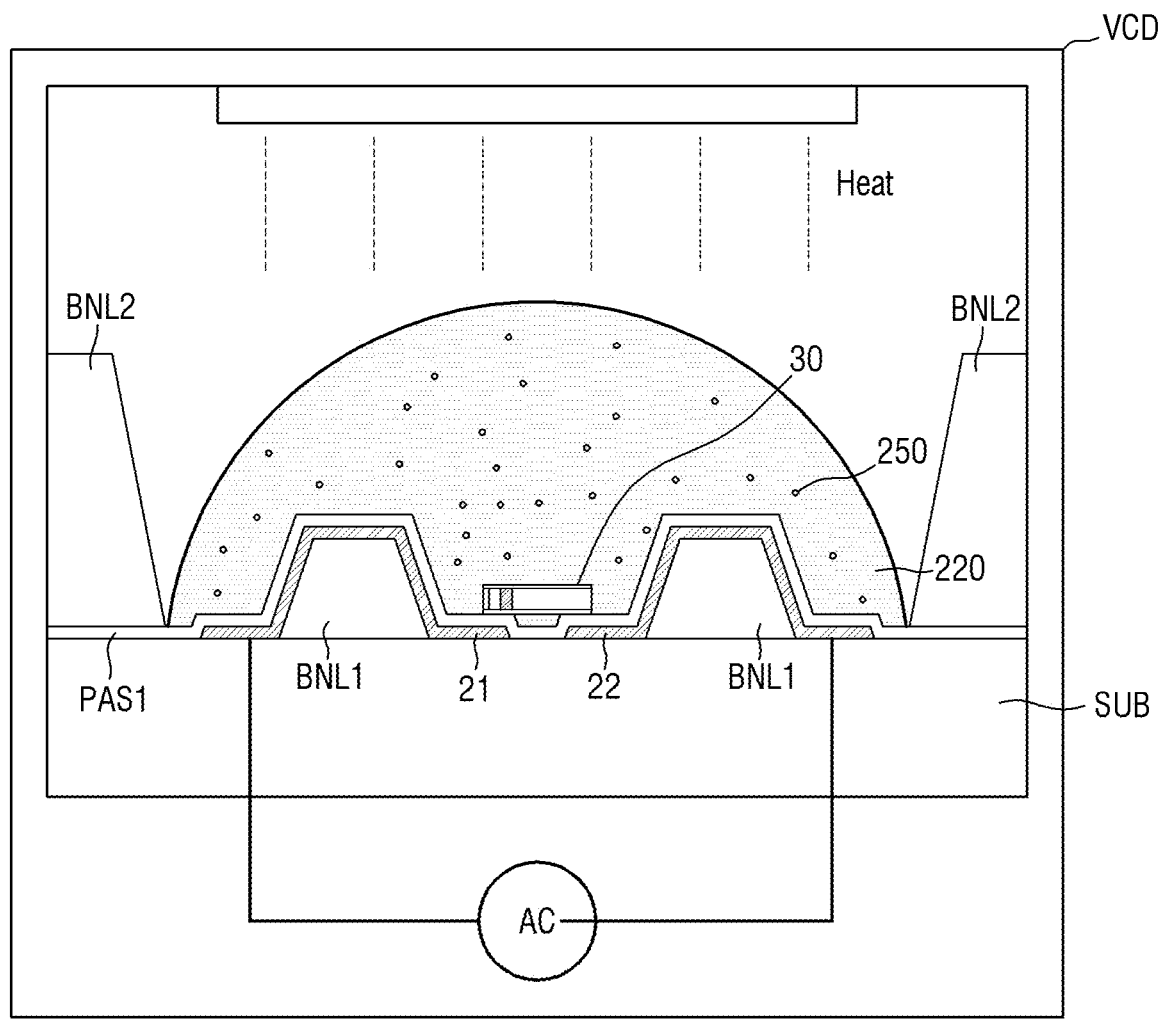
Figure 15:
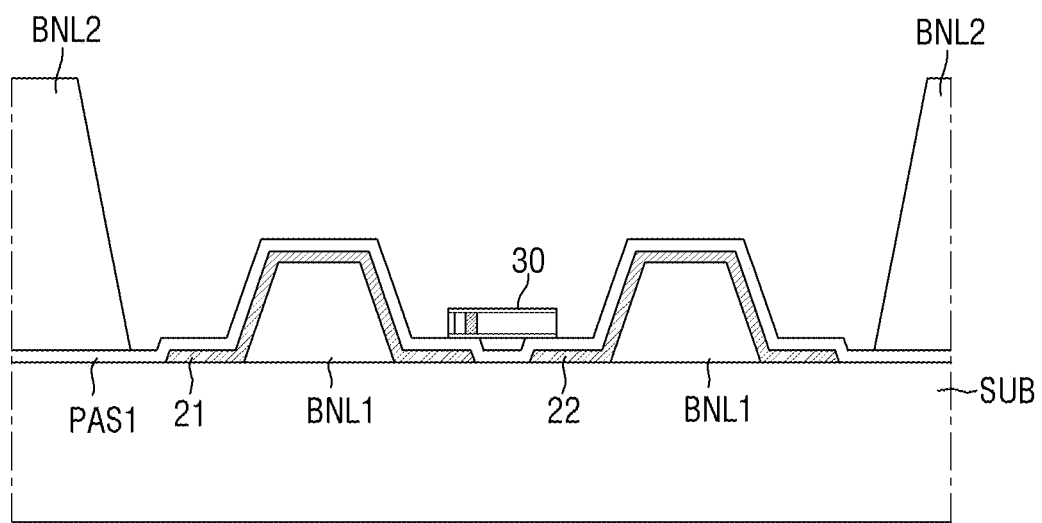

FIGS. 13 through 15 are cross-sectional views illustrating other active acts of the method of FIG. 8.

Referring first to FIG. 13, once the light-emitting element ink 200 including the light-emitting elements 30 is sprayed onto the target substrate SUB, an electric field EL is generated on the target substrate SUB by applying alignment signals to the first and second electrodes 21 and 22 (provided by source AC). The light-emitting elements 30 scattered in the light-emitting element solvent 220 may receive a dielectrophoretic force from the electric field EL and may be aligned on the first and second electrodes 21 and 22 while their alignment directions and locations are changing.

If the electric field EL is generated on the target substrate SUB, the light-emitting elements 30 may receive a dielectrophoretic force. If the electric field EL is generated in parallel (e.g., substantially in parallel) to the top surface of the target substrate SUB, the light-emitting elements 30 may be aligned on the first and second electrodes 21 and 22 to be in parallel (e.g., substantially in parallel) to the target substrate SUB. The light-emitting elements 30 may move from their initial locations toward the first and second electrodes 21 and 22 due to the dielectrophoretic force. While the locations and the alignment directions of the light-emitting elements 30 are being changed by the electric field EL, both ends of each of the light-emitting elements 30 may be arranged on the first and second electrodes 21 and 22. Each of the light-emitting elements 30 may include semiconductor layers doped with dopants of different conductivity types and may have a dipole moment. Thus, when placed on the electric field EL, the light-emitting elements 30 may receive a dielectrophoretic force and may thus have both end portions thereof on the first and second electrodes 21 and 22.

The degree of alignment of the light-emitting elements 30 may refer to any deviations (or substantially any deviations) in the alignment directions and the locations of the light-emitting elements 30 aligned on the target substrate SUB. For example, if there are large deviations in the alignment directions and the locations of the light-emitting elements 30, the degree of alignment of the light-emitting elements 30 may be understood as being low. On the contrary, if there are only small deviations in the alignment directions and the locations of the light-emitting elements 30, the degree of alignment of the light-emitting elements 30 may be understood as being high or improved.

Once the light-emitting elements 30 are arranged on the first and second electrodes 21 and 22, the removal of the solvent 220 may be performed by applying heat to the light-emitting element ink 200.

Referring to FIGS. 14 and 15, the removal of the light-emitting element solvent 220 may be performed in a chamber VCD capable of controlling the internal pressure thereof. The chamber VCD may control the internal pressure thereof, and the light-emitting element solvent 220 may be removed by applying heat to the target substrate SUB with the internal pressure of the chamber VCD controlled.

According to the method of FIG. 8, the light-emitting element solvent 220 can be completely removed via thermal treatment in a low-pressure environment. The removal of the light-emitting element solvent 220 may be performed at a pressure in a range of $10^{-4}$ Torr to 1 Torr and at a temperature in a range of 25° C. to 150° C. When thermal treatment is performed within the aforementioned pressure range, the boiling point of the light-emitting element solvent 220 may decrease, and as a result, the removal of the light-emitting element solvent 220 can be facilitated. Thermal treatment may be performed in the chamber VCD for 1 minute to 30 minutes, but the present disclosure is not limited thereto.

Thereafter, a plurality of insulating layers and contact electrodes are formed on the light-emitting elements 30 and the first and second electrodes 21 and 22, thereby obtaining the display device 10 of FIGS. 2 and 3. In this manner, the display device 10 including the light-emitting elements 30 can be obtained.

The display device 10 can be fabricated using the light-emitting element ink 200 including the surfactant 250. The display device 10 can have the light-emitting elements 30 arranged per unit area with a high degree of alignment, and the product reliability of the display device 10 can be improved.

Production Example and Experimental Examples 1 and 2 Will Hereinafter be Described Production Example Preparation of Light-Emitting Element Ink Ink #1 was prepared by mixing a glycol ether solvent and light-emitting elements to produce a light-emitting element ink. The light-emitting elements were mixed in an amount of 0.01 parts by weight based on 100 parts by weight of the light-emitting element ink. Ink #2 was prepared by mixing 0.01 parts by weight of a trifluoromethyl surfactant, based on 100 parts by weight of the light-emitting element ink, into ink #1. Ink #3 was prepared by mixing 0.01 parts by weight of a polysiloxane surfactant, based on 100 parts by weight of the light-emitting element ink, into ink #1

Experimental Example 1

Measurement of Surface Tension of Light-Emitting Element Ink

The surface tensions of ink #1, ink #2, and ink #3 were measured using the Du Noüy ring method.

Experimental Example 2

Measurement of Contact Angle of Light-Emitting Element Ink

Ink #1, ink #2, and ink #3 were dropped onto a glass substrate, and then, the respective contact angles of ink #1, ink #2, and ink #3 were measured.

The surface tensions and the contact angles of ink #1, ink #2, and ink #3 are as shown in Table 1 below.

TABLE 1

|  | Ink #1 | Ink #2 | Ink #3 |
| --- | --- | --- | --- |
| Surface Tension (mN/m) | 42.5 | 32.4 | 30.5 |
| Contact Angle (°) | 30.3 | 24.2 | 25.7 |

Referring to Table 1, the surface tensions of ink #2 including a F-based surfactant and ink #3 including a Si-based surfactant are at least 10 mN/m less than the surface tension of ink #1 including no surfactant, and the contact angles of ink #2 and ink #3 are at least 4 degrees smaller than the contact angle of ink #1.

Accordingly, as shown in Table 1, the surface tension and the contact angle of light-emitting element ink can be reduced by adding a F-based or a Si-based surfactant.

Figure 16:
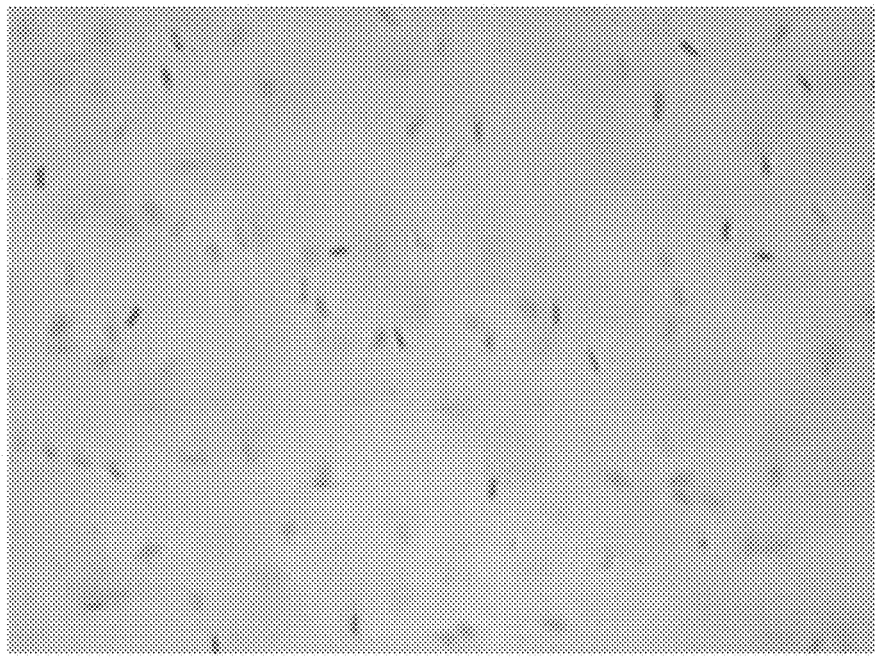
FIG. 16 is an optical scope image of ink #2 prepared according to a Production Example.
Figure 17:
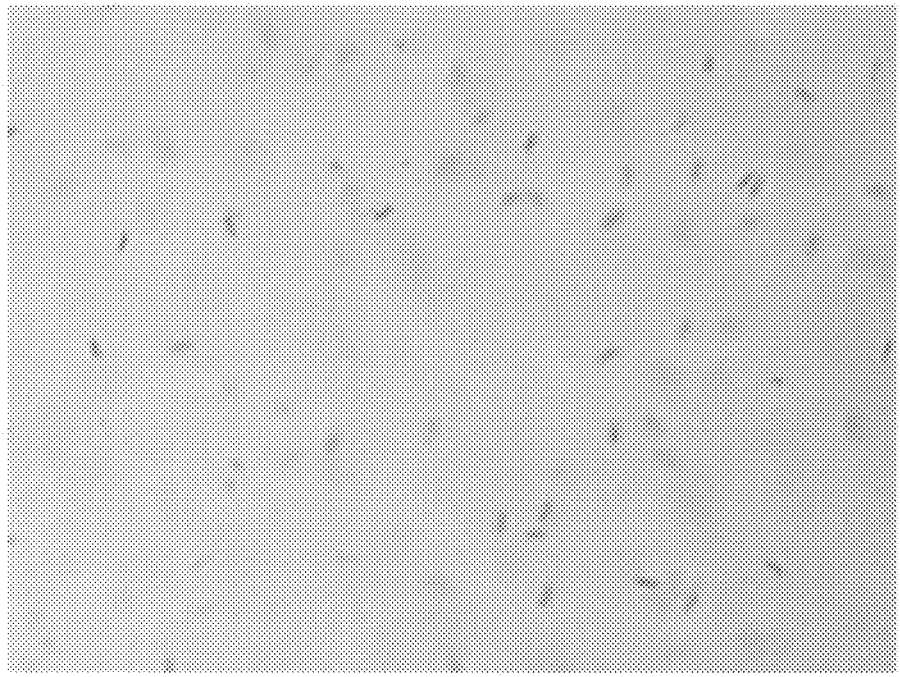
FIG. 17 is an optical scope image of ink #3 prepared according to the Production Example.

FIG. 16 is an image of ink #2 prepared according to the Production Example, and FIG. 17 is an image of ink #3 prepared according to the Production Example.

Referring to FIG. 16, in the case of ink #2, which contains a F-based surfactant in an amount of 0.01 parts by weight based on 100 parts by weight of the light-emitting element ink, light-emitting elements are evenly distributed in a solvent. Also, referring to FIG. 17, in the case of ink #3, which contains a Si-based surfactant in an amount of 0.01 parts by weight per 100 parts by weight of light-emitting element ink, light-emitting elements are evenly distributed in a solvent.

Accordingly, as shown in FIGS. 16 and 17, the dispersibility of light-emitting elements can be improved by adding a F-based or a Si-based surfactant to light-emitting element ink.

In concluding the detailed description, those skilled in the art will appreciate that many variations and modifications can be made to the disclosed embodiments without substantially departing from the spirit and scope of the present disclosure. Therefore, the disclosed embodiments of the present disclosure are used in a generic and descriptive sense only and not for purposes of limitation.

What is claimed is:

1. A display device comprising:
   a substrate;
   a plurality of first banks extending in a first direction on the substrate and spaced apart from each other;
   first and second electrodes extending in the first direction and on different ones of the first banks spaced apart from each other;
   a first insulating layer on the substrate and covering parts of the first and second electrodes;
   a plurality of light-emitting elements on the first insulating layer such that both end portions of each of the light-emitting elements are respectively on the first and second electrodes; and
   a fluorine-based and/or a silicon-based surfactant on a surface of the first insulating layer.

2. The display device of claim 1, wherein the surfactant is further on surfaces of the light-emitting elements.

3. The display device of claim 1, further comprising:
a first contact electrode on the first electrode such that the first contact electrode is in contact with first end portions of the light-emitting elements; and
a second contact electrode on the second electrode such that the second contact electrode is in contact with second end portions of the light-emitting elements.

4. The display device of claim 1, wherein:
each of the light-emitting elements comprises a first semiconductor layer, a second semiconductor layer, and at least one light-emitting layer between the first and second semiconductor layers, and
the first semiconductor layer, the second semiconductor layer, and the at least one light-emitting layer are surrounded by an insulating film.

* * * * *